United States Patent [19]
Welland

[11] Patent Number: 5,987,487
[45] Date of Patent: Nov. 16, 1999

[54] METHODS AND APPARATUS FOR THE PROCESSING OF DIGITAL SIGNALS

[75] Inventor: David R. Welland, Austin, Tex.

[73] Assignee: Cirrus Logic, Inc., Fremont, Calif.

[21] Appl. No.: 08/751,967

[22] Filed: Nov. 19, 1996

Related U.S. Application Data

[60] Provisional application No. 60/013,112, Mar. 11, 1996.

[51] Int. Cl.$^6$ .............................. G06F 7/38; G06F 17/10
[52] U.S. Cl. .......................... 708/491; 708/300; 708/319
[58] Field of Search ............................ 364/746, 724.01, 364/724.12, 724.16, 757; 341/61, 83, 95, 106, 144, 157

[56] References Cited

U.S. PATENT DOCUMENTS

| | | | |
|---|---|---|---|
| 4,107,783 | 8/1978 | Huang | 364/746 |
| 4,598,266 | 7/1986 | Bernardson | 341/106 |
| 4,816,805 | 3/1989 | Vojir et al. | 341/83 |
| 4,862,402 | 8/1989 | Shah et al. | 364/724.12 |
| 4,949,294 | 8/1990 | Wambergue | 364/746 |
| 5,008,668 | 4/1991 | Takayama et al. | 341/83 |
| 5,050,120 | 9/1991 | Houk | 364/746 |
| 5,077,793 | 12/1991 | Falk et al. | 364/746 |
| 5,107,451 | 4/1992 | Houk | 364/746 |
| 5,117,383 | 5/1992 | Fujita et al. | 364/746 |
| 5,187,420 | 2/1993 | Eddy et al. | 341/157 |
| 5,313,412 | 5/1994 | Nukui | 364/724.16 |
| 5,361,221 | 11/1994 | Fujita | 364/746 |

OTHER PUBLICATIONS

Oh and Garcia, "Implementation of a Parallel DFE Using Residue Number System", IEEE International Conference on Acoustics, Speech and Signal Processing, Adelaide, SA, Australia, Apr., 1994, pp. III/237–240.

Chren, Jr., "Low Delay Power Product CMOS Design Using One–Hot Residue Coding", Proceedings 1995 International Symposium on Low Power Design, Dana Point, CA, USA, Apr., 1995, pp. 145–150.

Szabo and Tanaka, "Residue Arithmatic and Its Applications to Computer Technology", McGraw–Hill, NY, NY, USA, 1967 pp. 39–56.

LaMacchia and Redinbo, "RNS Digital Filtering Structures for Wafer–Scale Integration", IEEE Journal on Selected Areas in Communication, vol. SAC–4, No. 1, Jan. 1986, NY, USA, pp. 67–80.

*Primary Examiner*—Emmanuel L. Moise
*Attorney, Agent, or Firm*—Roger W. Blakely, Jr.; Dan A. Shifrin

[57] ABSTRACT

Methods and apparatus for the processing of digital signals having high speed and low power dissipation. The apparatus uses Residue Number Systems (RNSs) to represent the signals and/or parameters, with each digit within an RNS system being encoded in a "one-hot" encoding scheme wherein each possible value of a digit has an associated single line, one and only one of which will be high at any one time. The combination of an RNS system with the one-hot scheme results in low signal activity and low loading of signal lines which in turn result in low power. Methods and apparatus for addition, subtraction, multiplication and other operations, and conversion from and to natural numbers. The speed advantage offered by other RNS-based architectures is retained.

68 Claims, 20 Drawing Sheets

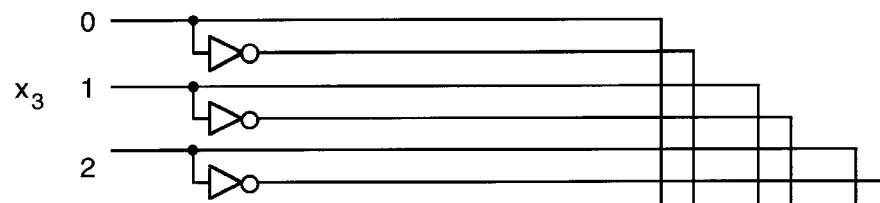
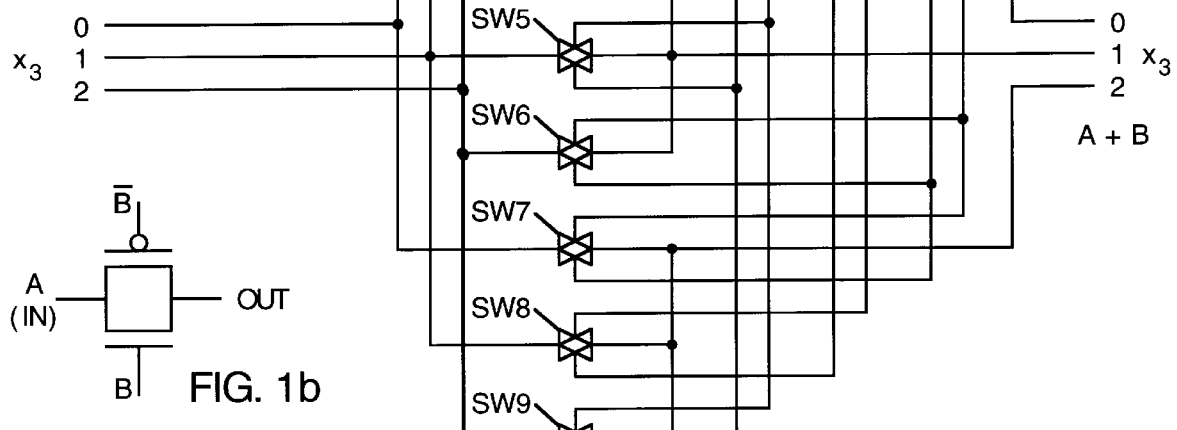
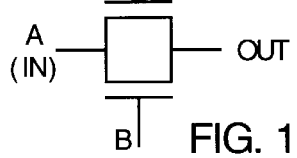
FIG. 1b
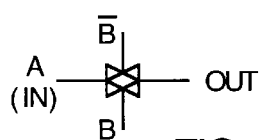
FIG. 1a
$X_3$ ADDITION
FIG. 2

Add the natural number 10

Subtract the natural number 10

Multiply by the natural number 10

Multiply by -1

Binary to RNS

Binary to RNS for x₃ and x₅

Binary to RNS

METHODS AND APPARATUS FOR THE PROCESSING OF DIGITAL SIGNALS

CROSS-REFERENCE TO RELATED APPLICATIONS

This application claims benefit of U.S. Provisional Application Ser. No. 60/013,112 filed Mar. 11, 1996.

BACKGROUND OF THE INVENTION

1. Field of the Invention

The present invention relates to methods and apparatus for the processing of digital signals.

2. Prior Art

Various architectures of digital signal processing circuitry such as digital filters and the like are well known in the art. Most of these architectures use a conventional binary numbering system to represent the parameters and the signals. Some architectures, though, use a Residue Number System (RNS) to represent both the parameters and the signals. An RNS representation has the advantage that the operations of multiplication, addition and subtraction—the basic operations in filtering, signal detection and the like—are exceedingly fast because, in contrast to a binary numbering system, no carries between digits are necessary to perform the operations. It has been reported in the literature that this speed advantage is the sole advantage of using an RNS system over using a conventional system of numbering.

In an RNS representation of a number X, the number is represented by a number of digits wherein each digit has its own limited range as follows:

$$X = x_{ma}, x_{mb}, \ldots, x_{mN}$$

where:

X = a natural number $x_{ma}, x_{mb}, \ldots x_{mN}$ are each a digit in the RNS representation of the natural number X wherein:

$x_{ma} = X \mod(m_a)$ = the remainder after X is divided by $m_a$. The remainder is therefore less than $m_a$.

$x_{mb} = X \mod(m_b)$, etc., and $m_a, m_b \ldots m_N$ are the different moduli (integer numbers), each associated with a respective digit in the RNS representation of the natural number X.

If the moduli are relatively prime, that is, the smallest single number into which all will divide evenly is equal to the product of all the moduli, then the range of numbers that can be uniquely represented in any particular RNS form $X = x_{ma}, x_{mb}, \ldots, x_{mN}$ is $m_a * m_b * \ldots * m_N$. This excludes the possibility of repetition of a modulus, but not even numbers or a perfect square. For instance note that 3, 4 and 5 are relatively prime in that the smallest single number into which all will divide evenly is 60, even though 4 is both an even number and a perfect square.

As an example of the foregoing, consider the example of a Residue Number System shown in Table 1. In this RNS, each integer is represented by three RNS digits $x_3$, $x_5$ and $x_7$, the subscript of each digit being the value of the associated modulus. Thus this is a 3, 5, 7 RNS, being able to distinguish 3*5*7=105 unique integers. As can be seen from Table 1, no RNS representation repeat in the range from 0 to 104, though the entire sequence begins to repeat again if one tries to extend the same to 105 and beyond.

TABLE 1

| Natural Number X | RNS digit $x_3$ | RNS digit $x_5$ | RNS digit $x_7$ |
|---|---|---|---|
| 105 | 0 | 0 | 0 |
| 104 | 2 | 4 | 6 |
| ... | ... | ... | ... |
| 15 | 0 | 0 | 1 |
| 14 | 2 | 4 | 0 |
| 13 | 1 | 3 | 6 |
| 12 | 0 | 2 | 5 |
| 11 | 2 | 1 | 4 |
| 10 | 1 | 0 | 3 |
| 9 | 0 | 4 | 2 |
| 8 | 2 | 3 | 1 |
| 7 | 1 | 2 | 0 |
| 6 | 0 | 1 | 6 |
| 5 | 2 | 0 | 5 |
| 4 | 1 | 4 | 4 |
| 3 | 0 | 3 | 3 |
| 2 | 2 | 2 | 2 |
| 1 | 1 | 1 | 1 |
| 0 | 0 | 0 | 0 |

As an example of how the RNS system works, consider the natural number 14. The $x_3$ digit is 14 mod(3)=the remainder 2, i.e. 14/3=4 remainder 2. The $x_5$ digit is 14 mod(5)=the remainder 4, i.e. 14/5=2 remainder 4. The $x_7$ digit is 14 mod(7)=the remainder 0 (14/7=2 remainder 0). It will be noted that each digit is determined without reference to any other digit in the RNS representation.

Also note that the same 3,5,7 RNS representation might be used to uniquely represent the numbers 105 to 209. However addition, subtraction and multiplication of any two numbers in the range of 105 to 209 all provide a result which is out of the range of 105 to 209, making this scheme rather useless for digital signal processing. Of particular interest for digital signal processing however, is the introduction of negative numbers by limiting the range of numbers representable in the RNS system chosen to an equal or substantially equal number of positive and negative numbers, as most signals processed will have or can be made to have a substantially zero average value. Such an assignment for a 3,5,7 RNS system is shown in Table 2. Again note that 105 numbers −52 to +52 are uniquely represented in the RNS, but the representations begin to repeat at 53 and −53. Note also that no separate sign is associated with positive or negative RNS numbers, but instead the sign is determined by the digits themselves once the RNS system and its range is selected. Finally, note that even the sign of the associated natural number represented in RNS form cannot be determined from any less than all the RNS digits in the RNS representation of the number.

TABLE 2

| Natural Number X | RNS digit $x_3$ | RNS digit $x_5$ | RNS digit $x_7$ |
|---|---|---|---|
| 53 | 2 | 3 | 4 |
| 52 | 1 | 2 | 3 |
| ... | ... | ... | ... |
| 15 | 0 | 0 | 1 |
| 14 | 2 | 4 | 0 |
| 13 | 1 | 3 | 6 |
| 12 | 0 | 2 | 5 |
| 11 | 2 | 1 | 4 |
| 10 | 1 | 0 | 3 |
| 9 | 0 | 4 | 2 |

TABLE 2-continued

| Natural Number X | RNS digit $x_3$ | RNS digit $x_5$ | RNS digit $x_7$ |
|---|---|---|---|
| 8 | 2 | 3 | 1 |
| 7 | 1 | 2 | 0 |
| 6 | 0 | 1 | 6 |
| 5 | 2 | 0 | 5 |
| 4 | 1 | 4 | 4 |
| 3 | 0 | 3 | 3 |
| 2 | 2 | 2 | 2 |
| 1 | 1 | 1 | 1 |
| 0 | 0 | 0 | 0 |
| −1 | 2 | 4 | 6 |
| −2 | 1 | 3 | 5 |
| −3 | 0 | 2 | 4 |
| −4 | 2 | 1 | 3 |
| −5 | 1 | 0 | 2 |
| −6 | 0 | 4 | 1 |
| −7 | 2 | 3 | 0 |
| −8 | 1 | 2 | 6 |
| −9 | 0 | 1 | 5 |
| −10 | 2 | 0 | 4 |
| −11 | 1 | 4 | 3 |
| −12 | 0 | 3 | 2 |
| −13 | 2 | 2 | 1 |
| −14 | 1 | 1 | 0 |
| −15 | 0 | 0 | 6 |
| ... | ... | ... | ... |
| −52 | 2 | 3 | 4 |
| −53 | 1 | 2 | 3 |

For RNS addition, each respective pair of digits of the two RNS numbers are added and the applicable modulo operation is performed on each respective sum.

Example

| Natural number | RNS |
|---|---|
| 8 | 2 3 1 |
| +4 | +1 4 4 |
| 12 | 3 7 5 |

But 3 mod(3)=0 and 7 mod(5)=2. Therefore the sum 375 in the RNS system is 025, representing the natural number 12 (see Table 2).

For subtraction, the same procedure is followed, though the modulus may have to be added back to bring the "remainder" into the range of 0 to the respective modulus minus 1.

Example

| natural number | RNS |
|---|---|
| 8 | 2 3 1 |
| minus 13 | 1 3 6 |
| −5 | 1 0 −5 |

But adding the applicable modulus of 7 to −5 gives a "remainder" of 2. Therefore plus 13 subtracted from plus 8 in this RNS system is 102, representing the natural number −5 (see Table 2).

For addition involving a negative number, the same procedure is followed as in addition of positive numbers.

Example

| Natural number | RNS |
|---|---|
| 8 | 2 3 1 |
| −13 | 2 2 1 |
| −5 | 4 5 2 |

But 4 mod(3) is 1 and 5 mod(5) is 0. Therefore −13 added to 8 in this RNS system is 102, again representing the natural number −5 (see Table 2).

Finally, in the case of multiplication, consider the following example:

Example

| Natural number | RNS |
|---|---|
| −3 | 0 2 4 |
| −4 | 2 1 3 |
| 12 | 0 2 12 |

But 12 mod(7) is 5. Therefore (−3)*(−4) in this RNS system is 025, again representing the natural number 12 (see Table 2).

It can be seen that addition, subtraction and multiplication of positive and negative numbers expressed in a RNS form work in the RNS system. The key observation to be made, though, is that the operations are performed on each RNS digit independently, without reference to results of the same operation on any other RNS digit. The high speed characteristic of RNS arithmetic is due to this "carry free" nature of the operations, whereas in conventional arithmetic, the results of multiplication, addition or subtraction of a particular digit cannot be finally determined until the results of the operation on less significant digits have been determined.

Division is also possible in an RNS system, with certain essential limitations. The principles of division in an RNS system may be illustrated as follows. In a single digit x of an RNS representation of a natural number X:

$X = m*N + x$ where: m=the modulus of the digit, a positive integer
N=an integer (which will be a negative integer for negative numbers)
x=the value of the RNS digit (the remainder, in the range of $0 \leq x \leq m-1$, after subtracting m*N from X)

For any individual RNS digit, only x, the value of the digit itself, is known. Knowledge of only a single digit does not give knowledge of X, or N for that digit.

The above equation for X may be written in various ways as follows:

$$X = m*N + x$$

$$X = m*(N-1) + (x+m)$$

$$X = m*(N-2) + (x+2*m)$$

$$X = m*(N-3) + (x+3*m)$$

...

$$X = m*(N-n) + (x+n*m)$$

...

where: n=is an arbitrary positive integer

The operation of division can occur on an RNS digit by RNS digit basis provided the following two conditions are met (the satisfaction of these two conditions will be commented on hereafter on a case by case basis):

1.) X is evenly divisible by the integer divisor d (remainder=0). Then X/d is clearly an integer number, and expressible in RNS form in the same RNS system as X.

2.) The divisor and the modulus of the RNS digit are relatively prime.

Using the above equations for X, X/d may be expressed in a conventional number system by any of the following equations:

$$X/d = m*N/d + x/d$$

$$X/d = m*(N-1)/d + (x+m)/d$$

$$X/d = m*(N-2)/d + (x+2*m)/d$$

$$X/d = m*(N-3)/d + (x+3*m)/d$$

$$...$$

$$X/d = m*(N-n)/d + (x+n*m)/d$$

$$...$$

If there is a value of n where $(x+n*m)/d$ is an integer, then because X/d is also an integer, $m*(N-n)/d$ is an integer. Therefore, $m*(N-n)$ must include a factor d. Since it is assumed that m is relatively prime with respect to d, (N−n) must include the factor d, and so (N−n)/d is also an integer.

Furthermore, if for one and only one value of n, $(x+n*m)/d$ is an integer in the range of 0 to m−1, then $X/d=m*(N-n)/d+(x+n*m)/d$ is in the form of the equation:

$$X/d = m*N_d + x_d$$

where:

$N_d$=the integer value of (X/d)/m=(N−n)/d $x_d=(x+n*m)/d$=the value of the RNS digit in the RNS representation of X/d If m and d are relatively prime, it is stated without proof will be one and only one value of n for which (x+n integer in the range of 0 to m−1.

By way of example, consider a digit of modulus 5 of an RNS representation of a number X evenly divisible by d. First consider 56 divided by 7=8. The modulus 5 RNS digit x of 56 is 1 and the modulus 5 RNS digit $x_d$ of 8 is 3. Therefore x=1 and $x_d$ should come out to be 3. Though not known from x, N=the integer value of 56/5=11. The possibilities for $x_d=(x+n*m)/d$ in the range of 0 to 4 for various values of n, and for $N_d$=(N−n)/d are shown in Table 3 below.

TABLE 3

| n | (x + n*m) (x = 1) | (x + n*m)/d (d = 7) | $N_d$ (N − n)/d | $X_d$ (x + n*m)/d = an integer |
|---|---|---|---|---|
| 0 | 1 | 1/7 | 11/7 | |
| 1 | 6 | 6/7 | 10/7 | |
| 2 | 11 | 11/7 | 9/7 | |
| 3 | 16 | 16/7 | 8/7 | |
| 4 | 21 | 21/7 = 3 | 7/7 = 1 | 3 |

While the foregoing only illustrates the division of 56 by 7, the second and third columns of Table 3 are the same for any number X evenly divisible by 7 and having an RNS digit of modulus 5 equal to 1. Thus in any RNS system in which one of the RNS digits has a modulus of 5, when that RNS digit has a value of 1 in the RNS representation of a number X evenly divisible by 7, the corresponding digit in the RNS representation of the result of dividing X by 7 will always be 3. The same procedure may be used to find the respective value of the RNS digit of modulus 5 in X/7 when the corresponding RNS digit in X has any of the other values 0, 2, 3 and 4 ($x_d$=0, 1, 4 and 2, respectively).

This same technique, of course, can readily be further extended to division in general wherein the divisor and the modulus of the digit are relatively prime and it is known that X/d is an integer. It also works for negative numbers. For instance, consider −49 divided by 7. For −49, an RNS digit of modulus 5 is also 1. Therefore, as before, the RNS digit of modulus 5 in the RNS representation of the result will be 3, which is the RNS digit of modulus 5 in the RNS representation of −7.

$x_d$ can also be found directly by using RNS multiplication of x by a number called the multiplicative inverse of d, as follows: Since $(x+n*m)/d=x_d$:

$$x+n*m=x_d*d$$

Multiplying both sides of the above equation by some integer $I_{dm}$:

$$x*I_{dm}+n*m*I_{dm}=x_d*d*I_{dm}$$

Then taking mod(m) of both sides gives:

$$(x*I_{dm}+n*m*I_{dm})\bmod(m)=(x_d*d*I_{dm})\bmod(m)$$

The term $n*m*I_{dm}$ on the left of the above equation can be dropped since it is an integer multiple of the modulus m, and an additional mod(m) operation can be inserted on the right without changing the result. Thus:

$$x*I_{dm} \bmod(m)=[x_d*(d*I_{dm} \bmod(m))] \bmod(m)$$

If an integer Idm can be found such that $$d*I_{dm} \bmod(m)=1$$

then $$x*I_{dm} \bmod(m)=xd \bmod(m)=x_d$$

$I_{dm}$, then, is the multiplicative inverse of d in the modulus m. If d is relatively prime with respect to m the multiplicative inverse exists (without proof herein), hereinafter denoted $d_m^{-1}$.

To find the multiplicative inverse $d_m^{-1}$ of d for the modulus m, it is not necessary to search through all integers for the integer $d_m^{-1}$ such that:

$$d*d_m^{-1} \bmod(m)=1$$

If $d_m^{-1}$ exists, then it is also true that $$[d*(d_m^{-1} \bmod(m))] \bmod(m)=1$$

Given d mod(m) then, it is only necessary to search from 1 through m−1 to find the inverse of d in the modulus m (the inverse cannot be 0).

Note that if d mod(m)=0, then no multiplicative inverse will be found. Of course, if d mod(m)=0, then d and m are not relatively prime and one of the two conditions for division has not been satisfied.

Thus rather than dividing by a number, such as a number d, one can multiply by $d_m^{-1}$, the multiplicative inverse of d.

To illustrate a multiplicative inverse, consider division by 13 for a modulo 5 digit of an RNS number. The digit may have values of 0, 1, 2, 3 or 4. Using the first approach to division described to divide by 13, the modulus 5 may be repeatedly added to the RNS digit value until the sum is evenly divisible by 13. In that regard, there will be only one such number evenly divisible by 13 to give a result of 0, 1, 2, 3 or 4, as shown in Table 4 below.

TABLE 4

| x<br>Value of the<br>modulo 5<br>digit | Add modulus<br>5 "n" times<br>n= | x + n*m<br>Value of the<br>modulo 5<br>digit<br>plus n*5 | $x_d$ Value<br>of the modulo<br>5 digit<br>divided by<br>13 |
|---|---|---|---|
| 0 | 0 | 0 | 0 |
| 1 | 5 | 26 | 2 |
| 2 | 10 | 52 | 4 |
| 3 | 2 | 13 | 1 |
| 4 | 7 | 39 | 3 |

However, multiplying the value of the modulo 5 digit times 2 gives an identical result. Thus for the modulo 5 digit, dividing by 13 is identical to multiplying by 2. Using the equation:

$$d_m^{-1} * d \bmod(m) = 1$$

$$5^{-1} * 13 \bmod(5) = 1$$

or again, $13_5^{-1} = 2$

While the operations of addition, subtraction and multiplication are carry free in an RNS system and hence simple and fast to execute, other operations that are simple and fast in a binary numbering system are cumbersome within an RNS system. For example, truncation in a binary system is simply the dropping of the least significant digits of the number to be truncated. In an RNS system, the digits do not have a relative significance, and therefore truncation is problematic.

Other operations that are difficult in an RNS number system include division, scaling (division by a fixed factor), sign detection, comparison, and dynamic range extension. As these are simple operations in binary, it is in principle possible to convert from an RNS number form to binary, perform the operation on the binary number, and then reconvert to an RNS number form if necessary (comparison and sign detection are results in themselves, and the RNS number or numbers on which they have operated may be preserved in RNS form for later use). However the Associated Mixed Radix (AMR) representation of a number can be found more naturally than the binary representation from the RNS representation.

Like a binary or decimal number, a mixed radix number is expressed by digits that have a relative significance. But unlike binary and decimal numbers, the weight of each digit is not a fixed multiple ("radix") of the weight of the immediately less significant digit.

The radix of a decimal number is 10. The value of the least significant digit ranges from 0 to 9. The next most significant digit, which also varies from 0 to 9, has a weight of 10. The next most significant digit has a weight of 100, 10 times larger than the weight of the previous digit, etc. The radix of a binary number is 2. The value of the least significant binary digit ranges from 0 to 1. The next most significant binary digit, which also varies from 0 to 1, has a weight of 2. The next most significant digit has a weight of 4, 2 times larger than the weight of the previous digit, etc.

The radix of a mixed radix number changes from digit to digit. Considering first only positive numbers, the value of the least significant digit ranges from 0 to p−1. The weight of the next most significant digit is "p". The value of this digit, though, ranges from 0 to q−1, where "q" in general is not equal to "p". The weight of the next digit is "q" times the weight of this digit, namely "p" times "q", and its value can range from 0 to yet 20 a different maximum.

Of interest here is when the radices of a mixed radix representation of an integer X are equal to the moduli $m_1$, $m_2$, etc. of the RNS representation of the integer X (hence the "Associated" Mixed Radix representation). The value of the least significant digit ranges from 0 to $m_1-1$, where $m_1$ is one of the RNS moduli. (Note that in the following discussion, the notation style has changed. Subscripts no longer indicate the value of the modulus, but rather merely distinguish between RNS system digits.) The next AMR digit, which has a weight of $m_1$, ranges from 0 to $m_2-1$, etc. The natural number X, then, in AMR form can be expressed as $$X = a_1 + a_2 * m_1 + a_3 * (m_1 * m_2) + a_4 * (m_1 * m_2 * m_3) + \ldots$$

where $a_1$, $a_2$, etc. are the AMR digit values. Note that the range under the AMR representation is identical to the range of the corresponding RNS representation of a number X. For instance, assume four AMR digits $a_1$, $a_2$, $a_3$ and $a_4$. Then X can range from zero to:

$$X_{max} = (m_1-1) + (m_2-1)*m_1 + (m_3-1)(m_1*m_2) + (m_4-1)*(m_1*m_2*m_3) = m_1*m_2*m_3*m_4 - 1$$

The values for the AMR digits $a_1$, $a_2$, etc. can be obtained from the RNS representation of X using the following methodology.

Consider a natural number X having the RNS representation $x_1, x_2, \ldots, x_N$ in the moduli $m_1, m_2, \ldots, m_N$. Again X can be expressed as:

$$X = a_1 + a_2 * m_1 + a_3 * m_1 * m_2 + \ldots + a_N * m_1 * m_2 * \ldots * m_{N-1}$$

where $a_1$, $a_2$, etc. are functions of $x_1$, $x_2$, etc.
By taking modulo $m_1$ of each side of the above equation:

$$X \bmod(m_1) = (a_1 + a_2 * m_1 + \ldots a_N * m_1 * \ldots * m_{N-1}) \bmod(m_1)$$

The left side of the above equation is simply equal to $x_1$. Note that $m_1$ is a factor in every term on the right side of the equation except the first, and therefore all terms except the first can be dropped. Therefore:

$$x_1 = a_1 \bmod(m_1) = a_1$$

Now subtract $a_1$ from X using RNS subtraction and divide the result by $m_1$ using RNS division to obtain the result X' in RNS form.

$$X' = (X - a_1)/m_1 = a_2 + a_3 * m_2 + \ldots + a_N * m_2 * \ldots * m_{N-1}$$

Note that subtracting $a_1$ from X drives the value of the $x_1$ digit of the RNS representation of X to zero, meaning that the result $X - a_1$ is evenly divisible by $m_1$, so that X' is an integer representable in RNS form. Also note that the divisor $m_1$ is relatively prime to all of the moduli except itself. Therefore, the two conditions for valid RNS division have been satisfied for all RNS digits except the first. Fortunately, the inability to legitimately divide the first digit is of no consequence, as the possible range of the result is diminished so as to be uniquely expressible by the remaining digits.

Now taking mod($m_2$) of X':

$$X' \bmod(m_2) = (a_2 + a_3 * m_2 + \ldots + a_N * m_2 * \ldots * m_{N-1}) \bmod(m_2)$$

Consequently:

$$x_2' = a_2 \bmod(m_2) = a_2$$

where $x_2'$ is the value of the second RNS digit after the subtraction of $a_1$ and the division by $m_1$.
Repeating the process as required:

$$a_1 = x_1, a_2 = x_2', a_3 = x_3'', \text{etc.}$$

As an example of the foregoing, consider the natural number 41 in the 3,5,7 RNS system of Table 1. The natural number 41 is 216 in RNS. Thus:

X=216 RNS $x_1 = a_1 = 2$

X−$a_1$=X−2=044 RNS

X'=(X−$a_1$)/3=36 RNS ($3_5^{-1}=2$, $3_7^{-1}=5$)

$x_2' = a_2 = 3$

X'−3=03 RNS

X''=(X'−3)/5=2 RNS=$x_3''=a_3$ ($5_7^{-1}=3$)

Thus $a_1=2$, $a_2=3$ and $a_3=2$.
As a check:

$$X = a_1 + a_2 * m_1 + a_3 * m_1 * m_2$$

$$X = 2 + 3*3 + 2*3*5 = 2 + 9 + 30 = 41$$

Now consider the Associated Mixed Radix representation of positive and negative numbers in the 3,5,7 RNS system of Table 2, wherein the numbers X range from −52 to +52. Again the AMR representation of a number X is:

$$X = a_1 + a_2 * m_1 + a_3 * m_1 * m_2$$

The moduli $m_1$, $m_2$ and $m_3$ are necessarily positive, but the values of $a_1$, $a_2$ and $a_3$ are not so limited, though each is limited in range to the range of the respective one of $m_1$, $m_2$ and $m_3$. Thus if:

$-1 \leq a_1 \leq +1$ $-2 \leq a_2 \leq +2$ $-3 \leq a_3 \leq +3$

Then X will range from $-1+(-2*3)+(-3*3*5)=-52$ to $+1+(+2*3)+(+3*3*5)=+52$, as in Table 2.

As an example of the foregoing, again consider the natural number 41 in the 3,5,7 RNS system of Table 2. The natural number 41 is 216 in RNS. Thus:

X=216 RNS $x_1 = a_1 \bmod(3) = 2$

Given that $x_1 = a_{1 \bmod(3)} = 2$ and $-1 \leq a_1 \leq +1$, $a_1$ must be −1.

X−$a_1$=X−(−1)=216 RNS+111 RNS=020 RNS

X'=(X−$a_1$)/3=40 RNS $x_2' = 4 = a_2 \bmod(5)$ $a_2 = -1$ (since $-2 \leq a_2 \leq +2$)

X'−$a_2$=X'−(−1)=40 RNS+11 RNS=01 RNS

X''=(X'−$a_2$)/5=3 RNS $x_3' = 3 = a_3 \bmod(7) = a_3$

Thus $a_1 = -1$, $a_2 = -1$ and $a_3 = 3$.
As a check:

$$X = a_1 + a_2 * m_1 + a_3 * m_1 * m_2$$

$$X = -1 + (-1*3) + 3*3*5 = -1 + (-3) + 45 = 41$$

In the preceding example including a range of negative numbers, all the moduli were odd (i.e., 3, 5 and 7), and the numbers representable in AMR form ranged from −52 to +52. For another system where the moduli are 2, 5, and 11, a range inclusive of positive and negative numbers could instead be from −55 to +54. More generally, the total range representable in AMR form is equal to M=m1*m2*..., the product of the moduli. If only positive numbers ranging from 0 are considered, then 0<=X<=M−1. If inclusive of negative numbers also, there are two possibilities of particular interest. If any one of the moduli is an even number, M will be an even number. Otherwise, M will be an odd number. Two possibilities of range inclusive of both positive and negative numbers can therefore be identified:

Pos/Neg, M even: −M/2<=X<=M/2−1
Pos/Neg, M odd: −(M−1)/2<=X<=(M−1)/2

The determination of the range of the possible values of the individual AMR digits depends on which of the two possibilities apply. If all moduli are odd, then M is odd and the total range is symmetrical about zero. It is therefore necessary for all the AMR digits to also have ranges symmetric about zero. For all AMR digits "aa" associated with moduli "m", then:

For all AMR digits (M odd): −(m−1)/2<=a<=(m−1)/2 as exemplified above in the 3, 5, 7 system.

If one of the moduli is even and M is therefore even, the range inclusive of both positive and negative numbers is not symmetric about zero and the determination of the range of AMR digit values is more complicated. First, note that there can be only one even modulus. Otherwise, the moduli in the RNS system would not be relatively prime (all even moduli would have a common factor of two). The range of AMR digit values depends on the location, in terms of significance, of the digit associated with the even modulus:

| | |
|---|---|
| AMR digit associated with the even modulus: | −m/2 <= a <= m/2 − 1 |
| AMR digits associated with odd moduli more significant than the digit associated with the even modulus: | −(m−1)/2 <= a <= (m−1)/2 |
| AMR digits associated with odd moduli less significant than the digit associated with the even modulus: | 0 <= a <= m−1 |

To understand this arrangement, note that while the total range with M even is asymmetrical about zero, it is only slightly so, and therefore the most significant digits that can have symmetric ranges need to have such. The even digit needs to have an asymmetric range, and it should be in favor of the negative values but only slightly so. Finally, if the even digit is not the least significant digit, even its slightly asymmetric range will give excessive asymmetry towards negative values in the total range, and the less significant odd digits need to acquire only positive values to compensate.

For example, the 2, 5, 11 RNS system briefly mentioned above could, again, represent the natural numbers from −55 to +54. If the AMR representation is such that the AMR digits, from the most significant to the least significant, are associated with the 11, 2, and 5 moduli respectively, then the digits should have the following ranges:

$$-5 <= a3 <= +5$$

$$-1 <= a2 <= 0$$

$$0 <= a1 <= +4$$

As a check, the minimum natural number X representable in AMR form is $$X_{min} = 0 + (-1)*5 + (-5)*5*2 = 0 - 5 - 50 = -55$$

and the maximum is $$X_{max} = 4 + 0*5 + 5*5*2 = 4 + 0 + 50 = +54$$

An AMR representation of a number has various uses, such as to create a new RNS digit for an expanded RNS representation of the number. To create the new RNS digit $x_{N+1}$ having modulus $m_{N+1}$:

$$X = a_1 + a_2*m_1 + a_3*m_1*m_2 + \ldots + a_N*m_1*m_2* \ldots *m_{N-1}$$

$$x_{N+1} = X \bmod(m_{N+1}) = (a_1 + \ldots + a_N*m_1* \ldots *m_{N-1}) \bmod(m_{N+1})$$

$$x_{N+1} = ((a_1) \bmod(m_{N+1}) + (a_2*m_1) \bmod(m_{N+1}) + \ldots) \bmod(m_{N+1})$$

Again as an example, consider the generation of a new RNS digit of modulus 11 for the natural number 41 expressed as the 3,5,7 RNS number 216, first in the all positive RNS representations of Table 1. It has already been determined that $a_1=2$, $a_2=3$ and $a_3=2$. In this case:

$$x_{N+1} = ((a_1) \bmod(m_{N+1}) + (a_2*m_1) \bmod(m_{N+1}) + (a_3*m_1*m_2) \bmod(m_{N+1})) \bmod(m_{N+1})$$

$$x_{N+1} = (2 \bmod(11) + (3*3) \bmod(11) + (2*3*5) \bmod(11)) \bmod(11)$$

$$x_{N+1} = ((2) + (9) + (30 \bmod(11))) \bmod(11)$$

$$x_{N+1} = (2+9+8) \bmod(11) = 19 \bmod(11) = 8$$

Obviously this is correct, in that 41 mod(11) is 8. Thus the natural number 41, expressed in a 3,5,7 RNS as 216 RNS, is expressed in a 3,5,7,11 RNS as 2168 RNS. While for the natural number 41 the additional RNS digit is redundant, the range of the natural numbers expressible in the new four digit 3,5,7,11 RNS is eleven times that expressible in the three digit 3,5,7 RNS. Note that it was not necessary to determine the actual value of X=41. $x_{N+1}$ was determined solely by the RNS and AMR digits. The foregoing is called "Base Extension".

Now consider the generation of a new RNS digit of modulus 11 for the natural number 41 expressed in the 3,5,7 positive and negative number RNS representations of Table 2. It has already been determined that in the positive and negative number range system, $a_1=-1$, $a_2=-1$ and $a_3=3$. In this case:

$$x_{N+1} = ((a_1) \bmod(m_{N+1}) + (a_2*m_1) \bmod(m_{N+1}) + (a_3*m_1*m_2) \bmod(m_{N+1})) \bmod(m_{N+1})$$

$$x_{N+1} = ((-1) \bmod(11) + (-1*3) \bmod(11) + (3*3*5) \bmod(11)) \bmod(11)$$

Thus:

$$x_{N+1} = ((10) + (8) + (45) \bmod(11)) \bmod(11)$$

$$x_{N+1} = (10+8+1) \bmod(11) = 19 \bmod(11) = 8$$

In electronic circuits, various encoding schemes are well known in the representation of digit values. In conventional binary encoding, each digit can be represented by a single signal, or a single "line". A line with a high voltage represents a binary "1". A line with a "low" voltage represents a binary "0". In binary coded decimal, each decimal digit is represented by four lines, and the various voltage levels on the lines determine the value of the decimal digit. Commonly used methods and apparatus for the processing of digital signals use one of these two representations of real numbers, most commonly the binary encoding. Decoding of a digit to a 1 of N form is also common, but not for digital processing, but rather for device addressing and for control purposes.

BRIEF SUMMARY OF THE INVENTION

Methods and apparatus for the processing of digital signals having high speed and low power dissipation are disclosed. The apparatus uses Residue Number Systems (RNSs) to represent the signals and/or parameters, with each digit within an RNS system being encoded in a "one-hot" encoding scheme wherein each possible value of a digit has an associated single line, one and only one of which will be high at any one time. The combination of an RNS system with the one-hot scheme results in low signal activity and low loading of signal lines which in turn result in low power. Methods and apparatus for addition, subtraction, multiplication and other operations, and conversion from and to natural numbers are disclosed. The speed advantage offered by other RNS-based architectures is retained. Alternate embodiments are disclosed.

BRIEF DESCRIPTION OF THE DRAWINGS

FIG. 1a illustrates a bilateral switch symbol used to simplify certain circuit diagrams to be described.

FIG. 1b presents the actual MOS circuit for the switch symbol of FIG. 1a.

FIG. 2 is an exemplary circuit diagram for addition of the modulo 3 digits of two numbers in a one-hot RNS system.

FIG. 17 is a circuit diagram for changing modulus from 13 to 5 for the subtractor 30 of FIG. 16a.

FIG. 18 is a circuit diagram for changing modulus from 13 to 2 for one set of two inputs to subtractor 36 of FIG. 16a.

DETAILED DESCRIPTION OF THE INVENTION

Figure 3:
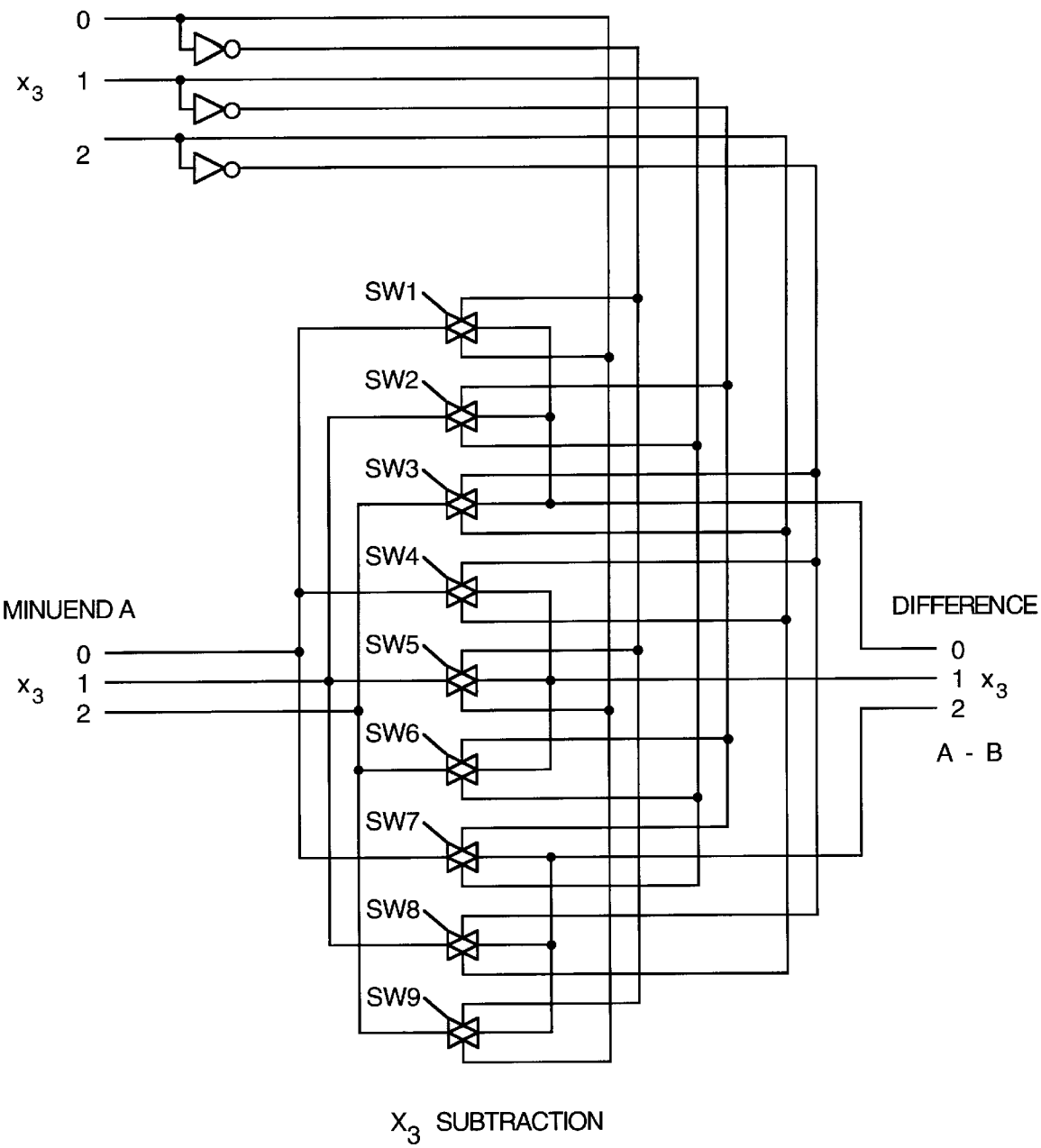
FIG. 3 is an exemplary circuit diagram for subtraction of the modulo 3 digits of two numbers in a one-hot RNS system.

In accordance with the present invention, RNS representations of numbers (signals, coefficients, etc.) are combined with a "one-hot" encoding scheme, wherein each possible value of a digit has an associated single line. When the digit takes on a particular value, the line associated with that value becomes high while all other lines are low. The term "one-hot" refers to the characteristic that at any given time one and only one line of a digit is high in this scheme. By way of example, if a 3,5,7 RNS were used, 3 lines would be used to represent the first digit, 5 lines would be used to represent the second digit and 7 lines would be used to represent the third digit. Since the digits in this RNS range from 0 to 2, 0 to 4, and 0 to 6, respectively, it is most convenient to similarly number the digit lines for each digit as 0 through 2, 0 through 4, and 0 through 6, respectively. Thus using the range of −52 to +52, the real number −13, represented by 221 RNS would be represented by the 3+5+7=15 lines, three of which would have a high voltage or state, with the others being low. The lines whose states represent the digits are numbered from zero, as follows in Table 5.

TABLE 5

NATURAL NUMBER −13 ONE-HOT RNS REPRESENTATION

| Line | Digit | Digit line | State |
|------|-------|------------|-------|
| 0    | $x_3$ | 0          | low   |
| 1    |       | 1          | low   |
| 2    |       | 2          | high  |
| 3    | $x_5$ | 0          | low   |
| 4    |       | 1          | low   |
| 5    |       | 2          | high  |
| 6    |       | 3          | low   |
| 7    |       | 4          | low   |
| 8    | $x_7$ | 0          | low   |
| 9    |       | 1          | high  |
| 10   |       | 2          | low   |
| 11   |       | 3          | low   |
| 12   |       | 4          | low   |
| 13   |       | 5          | low   |
| 14   |       | 6          | low   |

In the description to follow, unless indicated otherwise, a 3, 5, 7, RNS will generally be used in the exemplary description of the invention, it being recognized that larger moduli and/or a greater number of moduli will frequently be used in real systems for greater accuracy and/or to accommodate the results of operations prior to the scaling and/or truncation of the results of the operations. As will be obvious to one skilled in the art, from the following description, and as more specifically described later, the methods and circuits of the present invention are readily expandable as required for such purposes.

also in the circuits to be described herein, a bilateral switch symbol is used to simplify the circuit diagrams. This symbol is shown in FIG. 1a, with the actual MOS circuit of the bilaterial switch being shown in FIG. 1b. The MOS circuit is comprised of n-channel and p-channel devices connected in parallel and controlled by switching signals B and $\overline{B}$, respectively, $\overline{B}$ being the inverse of the signal B. When B is high, the output OUT of the switch is connected to A. Otherwise the output is electrically floating, regardless of the state of A.

First consider addition in the system of the present invention. For the $x_3$ digits of two numbers being added, there are only three combinations of digits that can be added to obtain a particular result. For instance, a result of 0 can only be obtained by adding 0+0, 1+2 or 2+1, a result of 1 can only be obtained by adding 0+1, 1+0 or 2+2, and a result of 2 can only be obtained by adding 1+1, 0+2 or 2+0. A circuit for accomplishing addition for the $x_3$ digits of two numbers being added is shown in FIG. 2. Here the 0, 1 and 2 lines of the A addend are provided as the A input of the switches (see FIGS. 1a and 1b). The signals on the B addend lines are inverted by the inverters shown so that both the signals on the B addend lines and their inverse are available, as required by the switches used in the preferred embodiment. The switches themselves are logically divided into three (the modulus of the digit being added) groups of three (again the modulus of the digit being added) switches. The output of the first three switches SW1, SW2 and SW3 determines whether the state of the 0 line of the SUM is high or low, the output of the second three switches SW4, SW5 and SW6 determines whether the state of the 1 line of the SUM is high or low and the output of the third three switches SW7, SW8 and SW9 determines whether the state of the 2 line of the sum is high or low.

To illustrate the operation of the circuit of FIG. 2, consider two examples. First consider the sum of the real numbers 4 (144 RNS) as addend A and 8 (231 RNS) as addend B, giving a sum of 12 (025 RNS). Since the circuit of FIG. 2 is only adding the first digits of the two RNS numbers, the addend A input is one and the addend B input is two, i.e. the voltage on the number 1 line of the addend A and the voltage on the number 2 line of addend B are both high, and the signals on the rest of the lines of addend A and B are low. With the voltage on the number 2 line of addend B high, switches SW2, SW6 and SW7 are on, and the rest of the switches SW1, SW3, SW4, SW5, SW8 and SW9 are off. With switch SW2 on, the voltage on line 1 of addend A (high) is coupled to line 0 of the SUM. With switch SW6 on, the voltage on line 2 of addend A (low) is coupled to line 1 of the SUM. With switch SW7 on, the voltage on line 0 of addend A (low) is coupled to line 2 of the SUM. Thus of lines 0,1,2 of $x_3$ of the SUM, line 0 and only line 0 is high, as it should be for a sum of 12 (025 RNS).

Now consider the same sum, but by reversing the addends, taking the real number 4 (144 RNS) as addend B and 8 (231 RNS) as addend A, again giving a sum of 12. Again since the circuit of FIG. 2 is only adding the first digits of the two RNS numbers, the addend A input is two and the addend B input is one, i.e. the voltage on the number 2 line of the addend A and the voltage on the number 1 line of addend B are both high, and the signals on the rest of the lines of addend A and B are low. With the voltage on the number 1 line of addend B high, switches SW3, SW4 and SW8 are on, and the rest of the switches SW1, SW2, SW5, SW6, SW7 and SW9 are off. With switch SW3 on, the voltage on line 2 of addend A (high) is coupled to line 0 of the SUM. With switch SW4 on, the voltage on line 0 of addend A (low) is coupled to line 1 of the SUM. With switch SW8 on, the voltage on line 1 of addend A (low) is coupled to line 2 of the SUM. Thus again, of lines 0,1,2 of $x_3$ of the SUM, line 0 and only line 0 is high, as it should be for a sum of 12 (025 RNS).

The same form of circuits for the addition of the $x_5$ and $x_7$ digits of two RNS numbers will be obvious from the foregoing. For instance, for the addition of the $x_5$ digits, 25 switches logically arranged in 5 groups of 5 would be used, as there would be 5 output lines to be determined, and each may be driven high by 5 combinations of addend inputs, as shown in Table 6 below.

TABLE 6

| $x_5$ addends | $x_5$ SUM (output) lines | | | | |
| A,B lines high | 0 | 1 | 2 | 3 | 4 |
| 0,0<br>1,4<br>2,3<br>3,2<br>4,1 | high | low | low | low | low |
| 0,1<br>1,0<br>2,4<br>3,3<br>4,2 | low | high | low | low | low |
| 0,2<br>1,1<br>2,0<br>3,4<br>4,3 | low | low | high | low | low |
| 0,3<br>1,2<br>2,1 | low | low | low | high | low |

TABLE 6-continued

| $x_5$ addends | $x_5$ SUM (output) lines | | | | |
| A,B lines high | 0 | 1 | 2 | 3 | 4 |
| 3,0<br>4,4<br>0,4<br>1,3<br>2,2<br>3,1<br>4,0 | low | low | low | low | high |

Similarly, for the addition of the $x_7$ digits, 49 switches logically arranged in 7 groups of 7 would be used, as there would be 7 output lines to be determined, and each may be driven high by 7 combinations of addend inputs.

Now consider subtraction in the system of the present invention. For the $x_3$ digits of two numbers being subtracted, there are again only three combinations of digits that can be subtracted to obtain a particular result. For instance, a result of 0 can only be obtained by 0–0, 1–1 or 2–2, a result of 1 can only be obtained by subtracting 1–0, 2–1 or 0–2, and a result of 2 can only be obtained by subtracting 2–0, 0–1 or 1–2. A circuit for accomplishing subtraction for the $x_3$ digits of two numbers is shown in FIG. 3. Here the 0, 1 and 2 lines of the A minuend are provided as the A input of the switches (see FIGS. 1a and 1b). Again, the signals on the B subtrahend lines are inverted by the inverters shown so that both the signals on the B subtrahend lines and their inverse are available, as required by the switches used in the preferred embodiment. The circuit components are identical to the circuit for addition, though the component interconnections are different. Again the switches themselves are logically divided into three groups (the modulus of the digit being added) of three switches (again the modulus of the digit being added). The output of the first three switches determines whether the state of the number 0 line of the DIFFERENCE is high or low, the output of the second three switches determines whether the state of the number 1 line of the DIFFERENCE is high or low and the output of the third three switches determines whether the state of the number 2 line of the DIFFERENCE is high or low.

Figure 4:
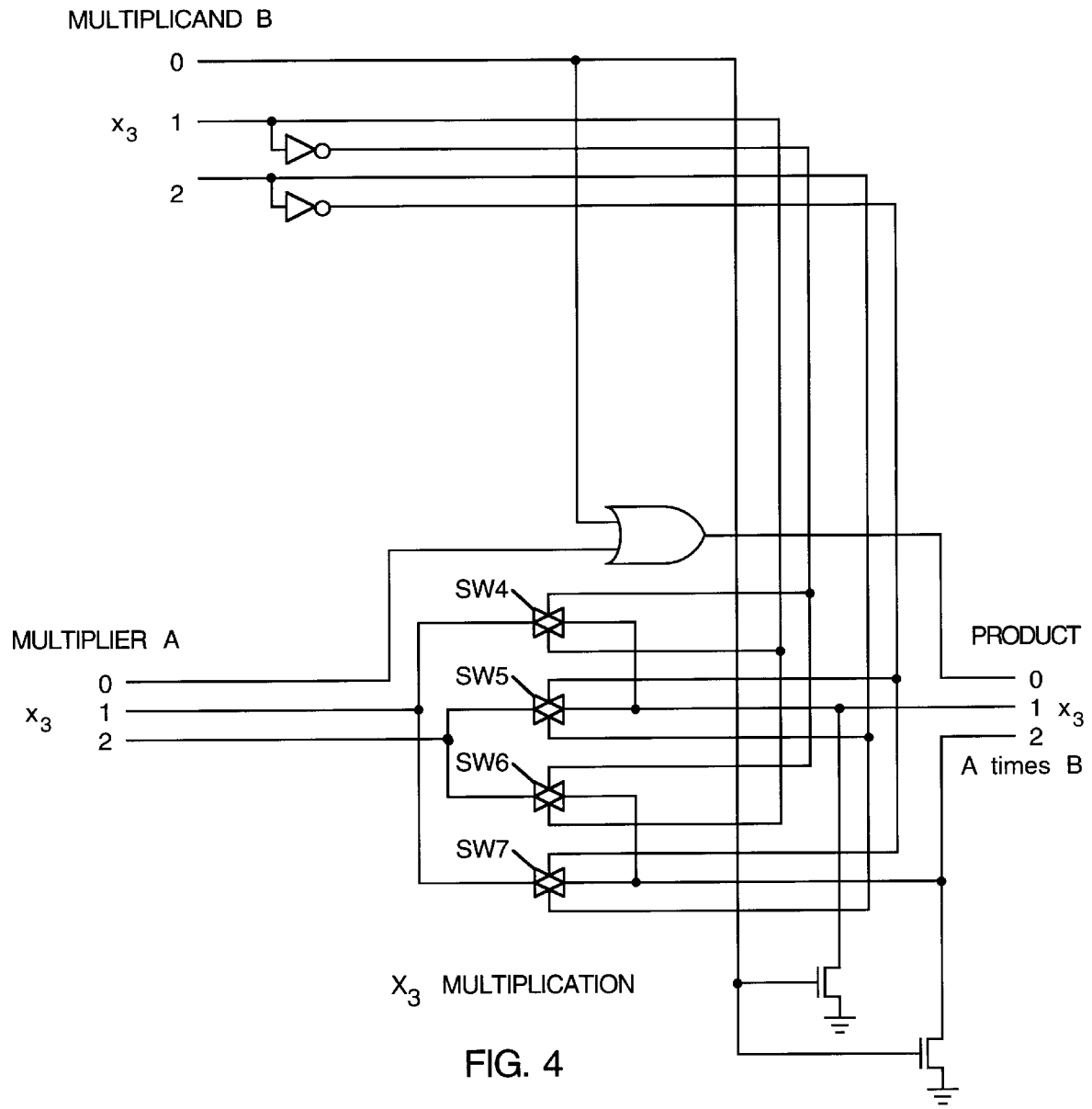
FIG. 4 is an exemplary circuit diagram for multiplication of the modulo 3 digits of two numbers in a one-hot RNS system.

Multiplication is similar for non-zero digits if the modulus is a prime number (the case where the modulus is not prime will be discussed below), but a zero digit (zero line high) in either the multiplier or the multiplicand dictates a zero (zero line high) in the result. Thus for the $x_3$ digit again, 1 times 1=1, 2 times 1=2, 1 times 2=2 and 2 times 2=4 mod(3)=1. These four conditions can be accounted for by the proper connection of switches as in the case of addition and subtraction, as shown by the four switch connections in FIG. 4. However if either the multiplier or the multiplicand is zero, the product must be zero (0 line high). This is provided by the OR gate in FIG. 4 which drives the 0 line in the product high whenever either the 0 line in the multiplier A or the 0 line in the multiplicand B is high. If however the 0 line in the multiplicand B is high, none of the switches SW1, SW2, SW3 and SW4 will be on. Consequently the number 1 line and the number 2 line in the product will be electrically floating. To positively pull these lines low when line number 0 in the multiplicand B is high, a pair of n-channel devices driven by line number 0 in the multiplicand B are provided, turning on to pull lines 1 and 2 low when line 0 of the multiplicand is high.

Now consider multiplication of RNS digits when the modulus of the digit is not a prime number. This means that the modulus may be expressed as the product of at least two other integers not equal to 1. Consider for instance the multiplication of two RNS digits of modulus 6, each of which therefore can have a value of 0, 1, 2, 3, 4 or 5. As before, 0 times any other digit value is 0. But now 2*3 and 3*2 are also both zero in RNS multiplication, as are 3*4 and 4*3. Thus not only must the presence of 0 in either (or both) one-hot RNS inputs be detected and in response the 0 one-hot line driven high and any resulting floating lines driven low as in FIG. 4, but in addition the same must be done when the inputs are 2 and 3, 3 and 2, 3 and 4 and 4 and 3. This may be done by 1) ANDing the 2 one-hot line of multiplier A and the one-hot 3 line of the multiplicand B, 2) ANDing the 3 one-hot line of multiplier A and the 2 one-hot line of the multiplicand B, 3) ANDing the 3 one-hot line of multiplier A and the 4 one-hot line of the multiplicand B, 4) ANDing the 4 one-hot line of multiplier A and the 3 one-hot line of the multiplicand B, and 5) ORing the result of the four ANDing operations, the 0 one-hot line of the multiplier A and the 0 one-hot line of the multiplicand B. Now if the result of the ORing operation is positive, the 0 line of the result should again be driven high and any other lines that would be electrically floating should be driven low, as with n-channel transistors like the two n-channel transistors in FIG. 4. Because of this and other similar complications, it is preferable to avoid the use of nonprime moduli.

Figure 5:
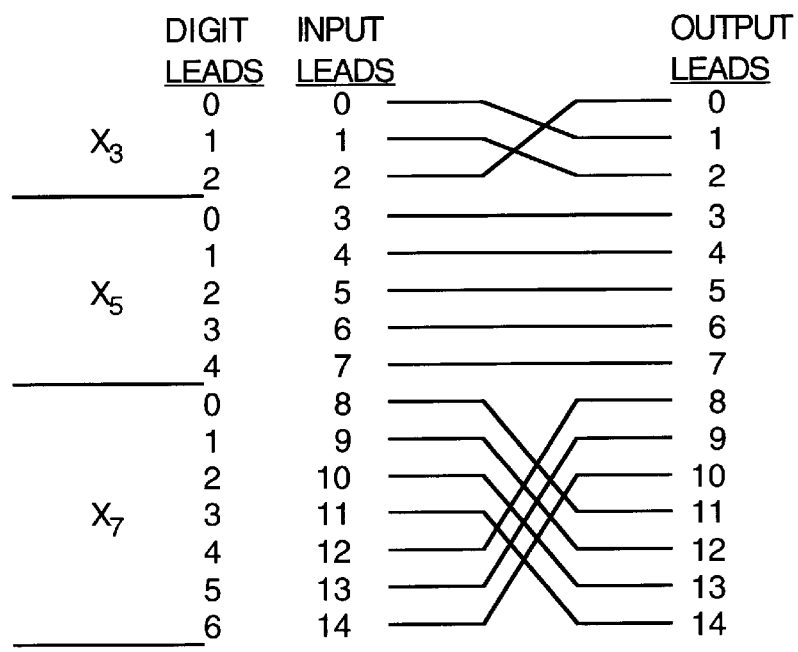
FIG. 5 is an exemplary circuit diagram for addition of the RNS equivalent (103) of the natural number 10 (a constant) to an arbitrary one-hot RNS input in a 3,5,7 one-hot RNS system.

Before considering conversion from and to natural numbers and other operations on RNS numbers, consider addition, subtraction and multiplication wherein one of the two numbers involved in the addition, subtraction or multiplication is a fixed number. Multiplication by a fixed coefficient is particularly common in the processing of digital signals, for filtering, signal detection and/or demodulation and many other functions. Obviously the fixed input can be applied as either the A input or the B input of the addition, subtraction and multiplication circuits of FIGS. 2, 3 and 4. However, assume the fixed number is applied as the B input of these circuits. This permanently sets the switches in the circuits, so that the switches can be eliminated in favor of hardwiring (in integrated circuit form) the connections that otherwise would have been made by the switches. As an example consider the addition, subtraction and multiplication by the natural number 10 (103 RNS in the exemplary RNS system). FIG. 5 shows the addition of the RNS equivalent (103) of the natural number 10 to an arbitrary one-hot RNS input. Adding 1 to any value of the $x_3$ digit will obviously increase the value by 1. Thus the number 0 line of the input is directly connected to the number 1 line of the output and the number 1 line of the input is directly connected to the number 2 line of the output. The sum of (2+1)mod(3)=0, so the number 2 line of the input is connected to the number 0 line of the output. The $x_7$ connections are determined the same way, advancing, with wrap around, 3 instead of 1 in the interconnection of the lines. Because the $x_5$ digit is 0, no change between the input and the output occurs. Therefore they are directly connected. The net effect, however, is that the sum resulting from the addition of a constant is, in a general sense, really only a renumbering (and probably a rerouting) of the input lines.

Figure 6:
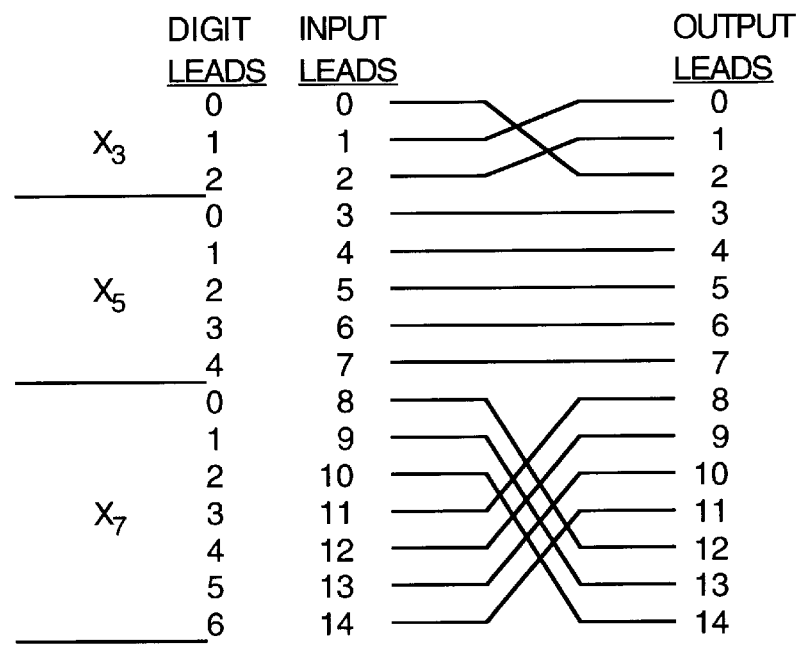
FIG. 6 is an exemplary circuit diagram for subtraction of the RNS equivalent (103) of the natural number 10 (a constant) from an arbitrary one-hot RNS input in a 3,5,7 one-hot RNS system.

Subtraction of the RNS equivalent (103) of the natural number 10 from an arbitrary one-hot RNS input is very similar (but not with identical circuit interconnections), as shown in FIG. 6. Here again, the difference resulting from the subtraction of a constant is, in a general sense, really only a renumbering of the input lines. In fact it is the same as the addition circuit if the input and the output of the addition circuit are reversed. This, however, is no surprise, as X+10−10=X. It illustrates another point about the present invention, however. That is, that operations that involve successive operations with constants can be concatenated into a single "renumbering". This will be illustrated after considering the multiplying by a constant and the change in sign of a number (multiplying by −1), as disclosed below.

Figure 7:
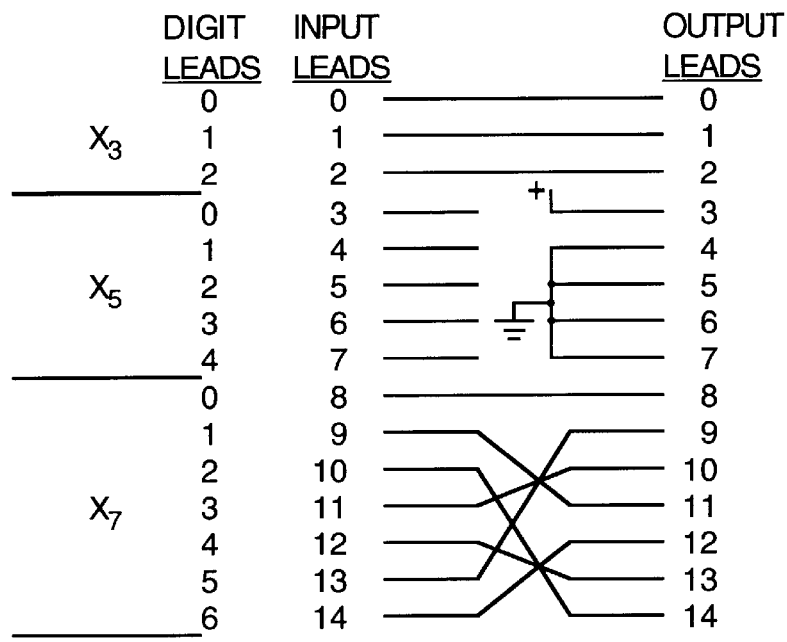
FIG. 7 is an exemplary circuit diagram for multiplying by 10 in a 3,5,7 one-hot RNS system.
Figure 8:
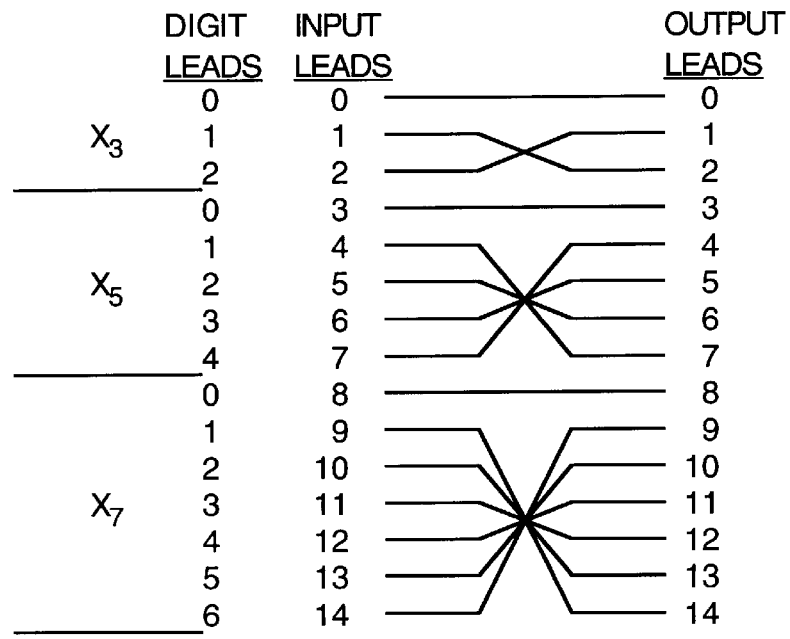
FIG. 8 is an exemplary circuit diagram for changing sign (multiply by −1) in a 3,5,7 one-hot RNS system.

A circuit for multiplying by 10 is shown in FIG. 7. Note that any natural number multiplied by 10 will be divisible by 5, so that the zero line of the $x_5$ digit is always high, independent of the input. Similarly, a circuit for multiplying by −1 is shown in FIG. 8. Here 0 times anything is 0, and −1 times any RNS digit of mod(m)=m−(the original RNS digit).

Regarding concatenation, consider the operations of subtracting 10 from an input, multiplying the result by 10 and then changing the sign of the result by multiplying by −1. This is shown in step by step sequence in Table 7 below.

TABLE 7

| | | Column | | |
|---|---|---|---|---|
| 1 Input lines for input signal "X" | 2 X-10 (FIG. 6) | 3 Connection | 4 Multiply (X-10) by 10 (FIG. 7) | 5 Multiply by −1 (FIG. 8) |
| 0 | 2 | Yes | 2 | 1 |
| 1 | 0 | Yes | 0 | 0 |
| 2 | 1 | Yes | 1 | 2 |
| 3 | 3 | No | 3 high | 3 high |
| 4 | 4 | No | 4 low | 7 low |
| 5 | 5 | No | 5 low | 6 low |
| 6 | 6 | No | 6 low | 5 low |
| 7 | 7 | No | 7 low | 4 low |
| 8 | 12 | Yes | 13 | 10 |
| 9 | 13 | Yes | 9 | 14 |
| 10 | 14 | Yes | 12 | 11 |
| 11 | 8 | Yes | 8 | 8 |
| 12 | 9 | Yes | 11 | 12 |
| 13 | 10 | Yes | 14 | 9 |
| 14 | 11 | Yes | 10 | 13 |

The first two columns of Table 7 represent the mapping of the input to the output of FIG. 6 for subtracting the natural number 10. The third column indicates whether the lines of the second column are connected to the output of the multiplier circuit of FIG. 7 The fourth column relative to the second column shows the mapping of the input to the output of FIG. 7 for multiplying by the natural number 10. Finally, the fifth column relative to the fourth column represents the mapping of the input to the output of FIG. 8 to change the sign of the result of the previous operations by multiplying by −1. But the combinations of operations may be represented by a single circuit: a single "renumbering" of the input and output leads, taken directly from Table 7, as follows in Table 8.

TABLE 8

| | Table 7 Column | |
|---|---|---|
| 1 Input lines for input signal "X" | 3 Connection | 5 (X-10) (10) (−1) X-10 (FIG. 6) multiply result by 10 (FIG. 7) change sign of result (FIG. 8) |
| 0 | Yes | 1 |
| 1 | Yes | 0 |
| 2 | Yes | 2 |
| 3 | No | 3 high |
| 4 | No | 7 low |

TABLE 8-continued

Table 7 Column

| 1<br>Input lines<br>for input<br>signal<br>"X" | 3<br>Connection | 5<br>(X-10) (10) (−1)<br>X-10 (FIG. 6)<br>multiply result<br>by 10 (FIG. 7)<br>change sign of<br>result (FIG. 8) |
|---|---|---|
| 5 | No | 6 low |
| 6 | No | 5 low |
| 7 | No | 4 low |
| 8 | Yes | 10 |
| 9 | Yes | 14 |
| 10 | Yes | 11 |
| 11 | Yes | 8 |
| 12 | Yes | 12 |
| 13 | Yes | 9 |
| 14 | Yes | 13 |

Figure 9:
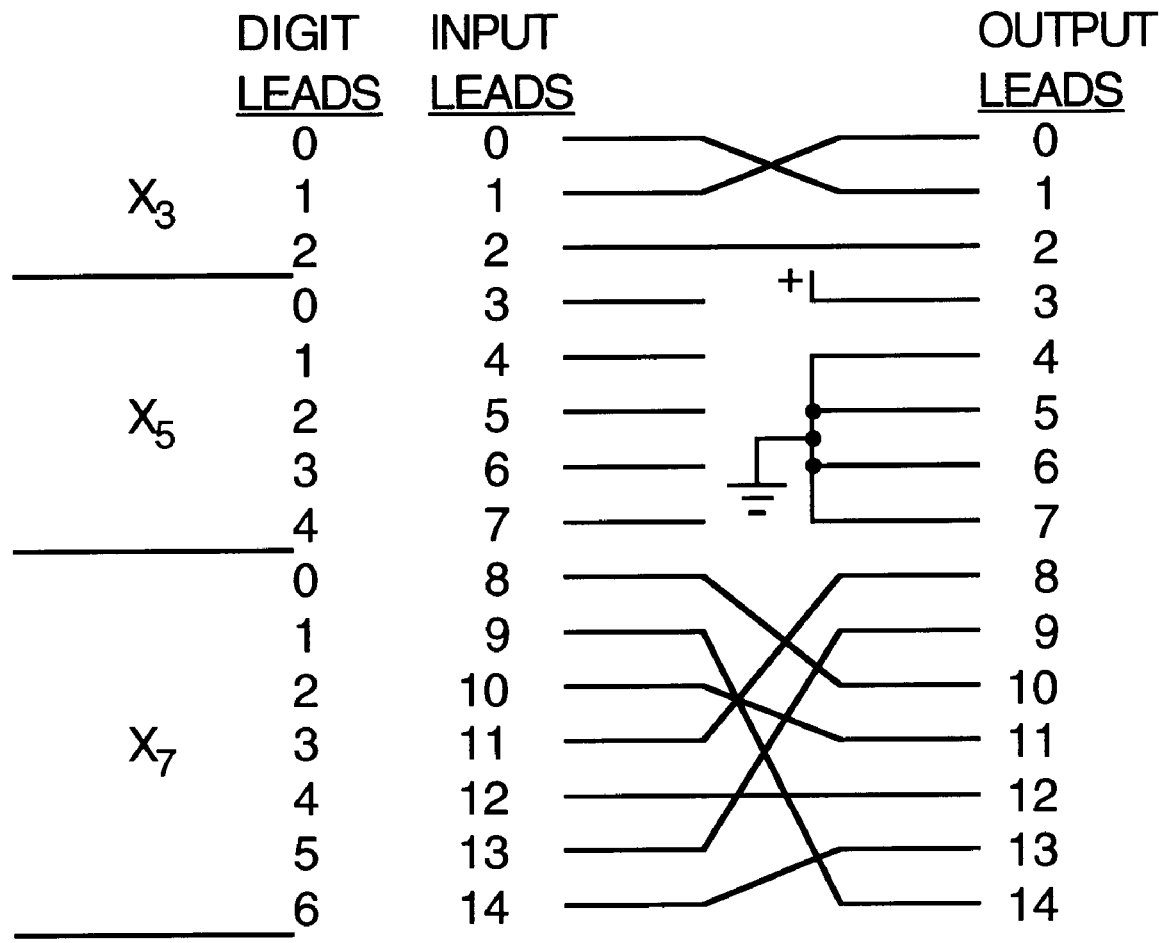
FIG. 9 is an exemplary circuit diagram for concatenation of certain operations in a one-hot RNS system.

The foregoing is shown in circuit form in FIG. 9. As an example, consider an input of natural number 14 (240 RNS). (14 minus 10)*10*(−1) is −(4*10)=−40. The RNS representation of the natural number −40 in the 3,5,7 RNS representation is −40 mod(3),−40 mod(5), −40 mod(7)=202 RNS. The input natural number 14 (240 RNS) results in the 3 digit line 2 high, the 5 digit line 4 high and the 7 digit line 0 high, with the rest of the lines being below. This corresponds to input leads 2, 7 and 8 being high, with the rest being low. Input lead 2 high happens to make the output lead 2 high. Input lead 8 high makes the output lead 10 high, and the fixed coupling of output leads 3 through 7 makes output lead 3 high regardless of which one of input leads 3 through 7 is high. Output leads 2, 3 and 10 high correspond to digit leads 2, 0 and 2 being high, representing the RNS number 202, shown above to represent the natural number −40 as expected.

Figure 10:
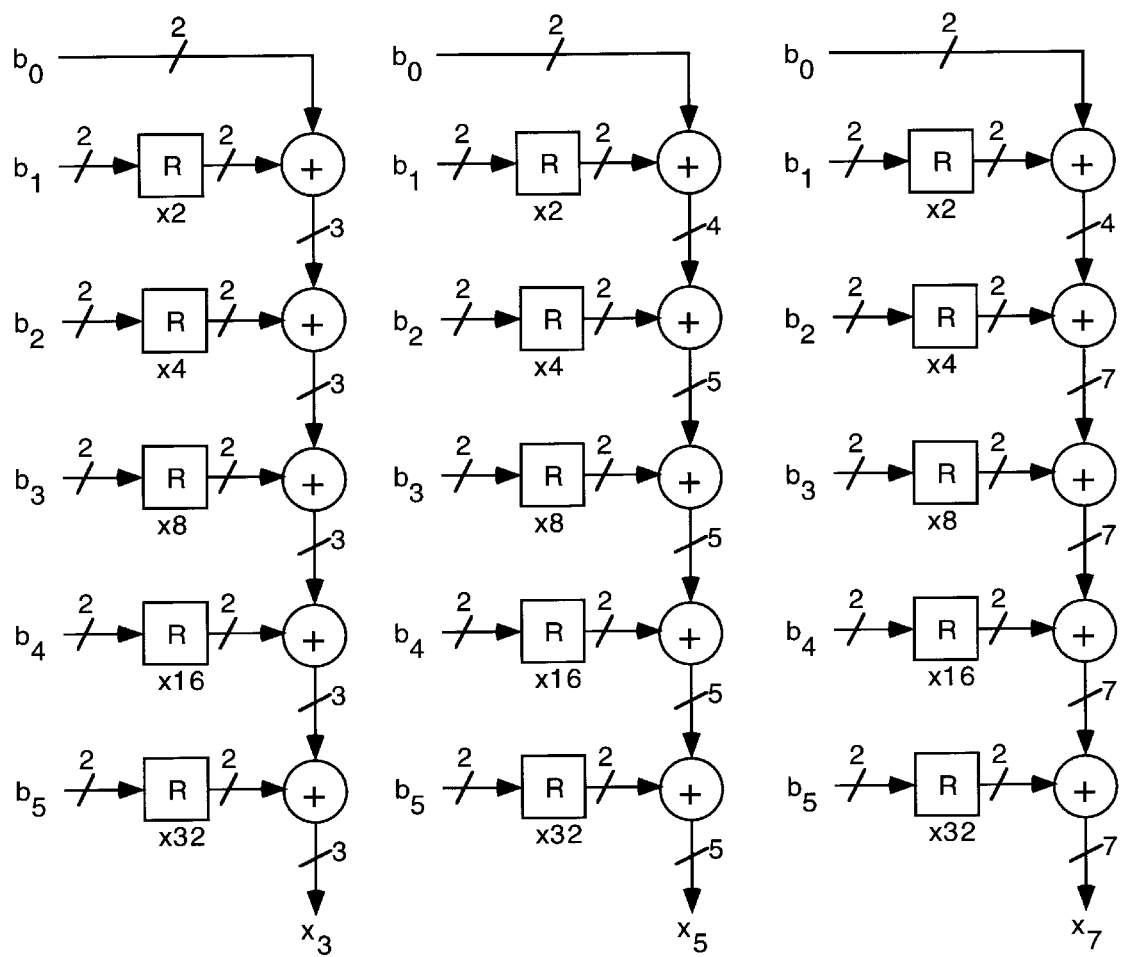
FIG. 10 is a block diagram for a circuit for the conversion of an unsigned binary number to a 3,5,7 one-hot RNS system representation.

Now consider the conversion of a binary number to an RNS number, again in the 3,5,7 RNS system, now having the natural number range of 0 to 104. If a 7 bit binary number is used, then care must be exercised to not exceed the total range of 105 of the RNS number by the 7 bit binary number which has a total range of 128. If only a 6 bit number is to be converted, then the range limitation is imposed in the binary domain, not the RNS domain. For specificity in the example, assume a 6 bit binary number. The least significant bit adds 0 or 1, the next least significant bit adds 0 or 2, the next least significant bit adds 0 or 4, etc. Thus each binary bit can be added in accordance with its weight modulo(the respective modulus). A circuit for doing this is shown in block diagram form in FIG. 10, and in more detail for the $x_3$ and $x_5$ digits in FIG. 11. In the circuit of FIG. 10, the boxes with the "R" therein are fixed multiplier circuits, which are nothing but a renaming (and rerouting) of the "b" inputs thereto. Note that all "b" signals in one-hot form have only 2 lines that can be high; the 1 line and the 0 line. These two can be readily generated from a traditional binary encoding scheme by routing the respective $b_n$ line to the number 1 one-hot line and its inverse $\overline{b}_n$ to the number 0 one-hot line. The other one-hot lines are effectively tied low. The circles with the + therein in FIG. 10 and the boxes marked "ADD" in FIG. 11 are adder circuits in accordance with the adder of FIG. 2.

Figure 11:
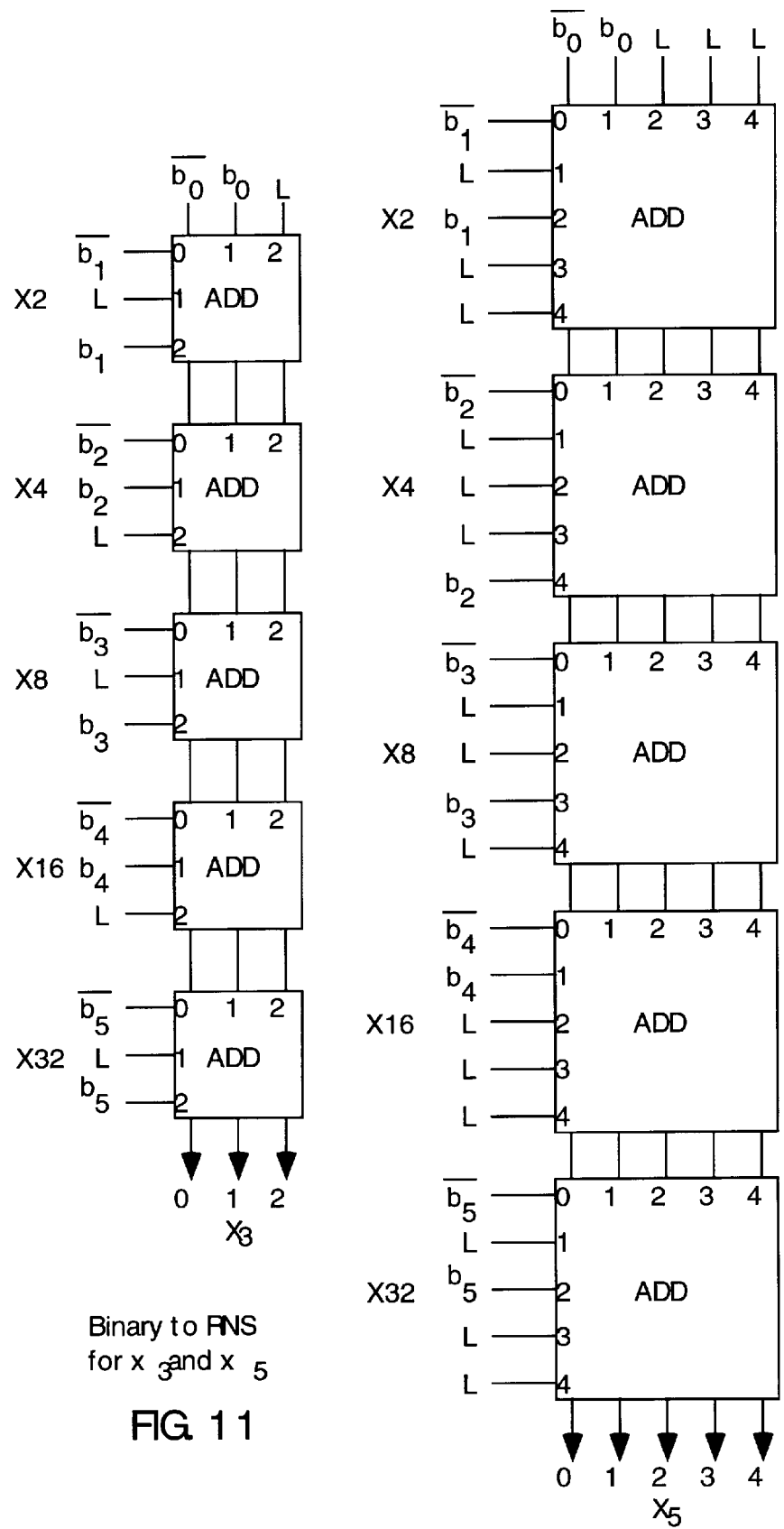
FIG. 11 is a circuit diagram for the conversion of an unsigned binary number to the modulo 3 and modulo 5 digits of a one-hot RNS system.

Referring to FIG. 10 and particularly to FIG. 11, in the adder string for forming the three $x_3$ digit one-hot lines of the binary to RNS converter, the $b_0$ input to the respective adder is connected to the number 1 line of the $x_3$ digit input to the adder and its inverse $\overline{b}_0$ forms the number 0 line of the adder. The number 2 input line to this input of the adder is tied low, as the $b_0$ input to the adder can only represent a 0 or a 1, depending on whether $b_0$ is low or high, respectively. The $b_1$ input to the respective adder is connected to the number 2 line of the $x_3$ digit input to the adder and its inverse $\overline{b}_1$ forms the number 0 line of the adder. The number 1 input line to the adder is tied low, as the $b_1$ input to the adder can only represent a 0 or a 2, depending on whether $b_1$ is low or high, respectively. The $b_2$ input to the next adder is connected to the number 1 line (4 mod(3)=1) of the $x_3$ digit input to the respective adder and its inverse $\overline{b}_2$ forms the number 0 line of the adder. The number 2 input line to the adder is tied low, as the input to this adder can only represent a 0 or a 4, depending on whether $b_2$ is low or high, respectively, etc.

Figure 12:
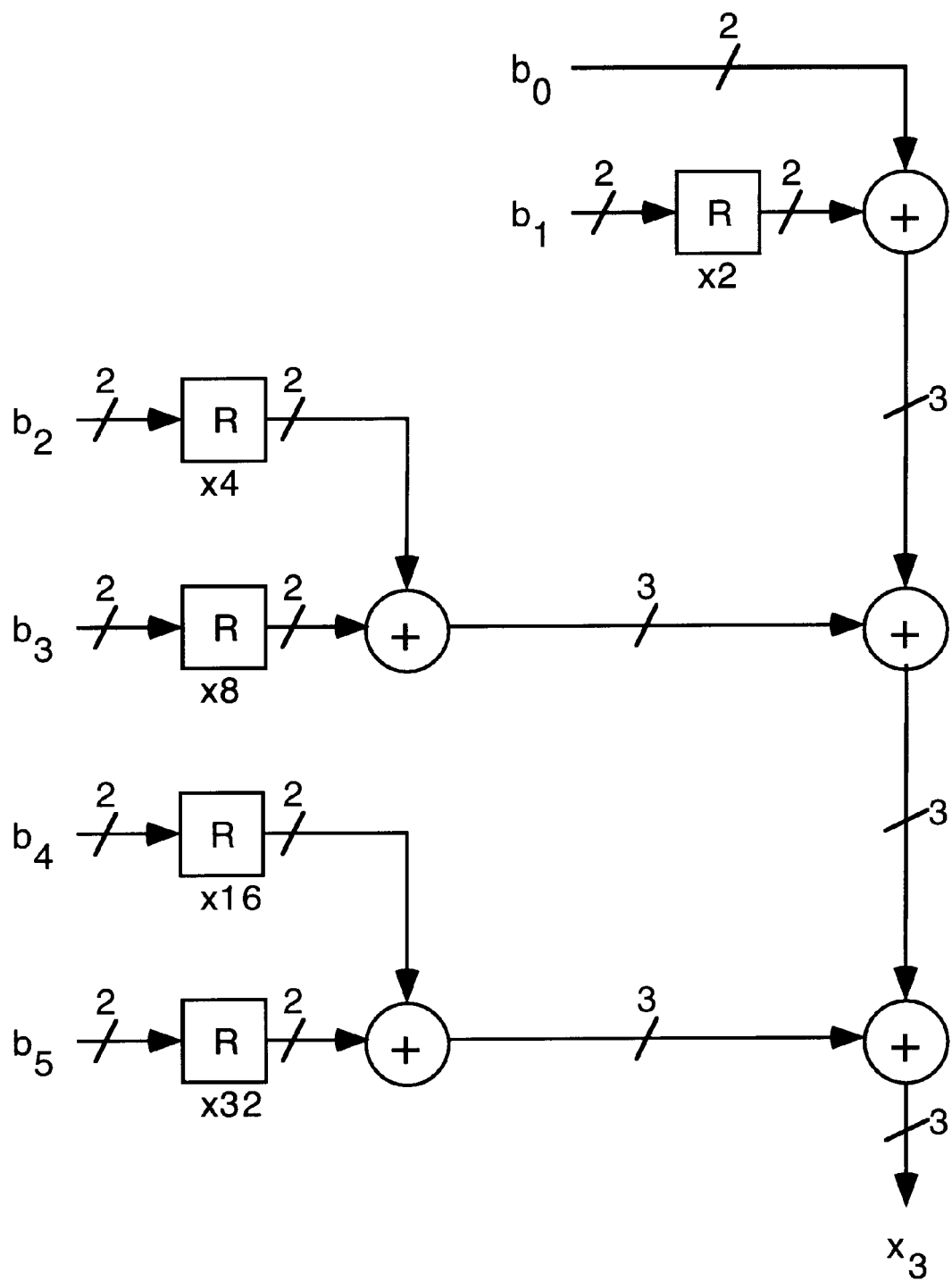
FIG. 12 is an alternate circuit diagram for the conversion of an unsigned binary number to the modulo 3 digit of a one-hot RNS system.

Referring again to FIGS. 10 and 11, note that for the conversion of the number from a six binary bit representation to a 3,5,7 RNS representation, three chains of five adders each are shown, the first to add $b_0$ and $b_1$, the second to add $b_2$ to the sum, etc. This will have a ripple-through time delay, and waste some power because of the possibility of multiple changes of state during the ripple-through. An alternate implementation shown in FIG. 12 would be to use in each adder group, one adder to add $b_0$ and $b_1$, a second adder to add $b_2$ and $b_3$ at the same time, and a third adder to add $b_4$ and $b_5$ at the same time. Then a two adder chain could be used to add ($b_0+b_1$) to ($b_2+b_3$) and then to add the result to ($b_4+b_5$). While this requires the same number of adders, the adder chaining is reduced from a string of five adders to a string of three adders, reducing the ripple-through time and potentially the number of ripple-through state changes.

Figure 13:
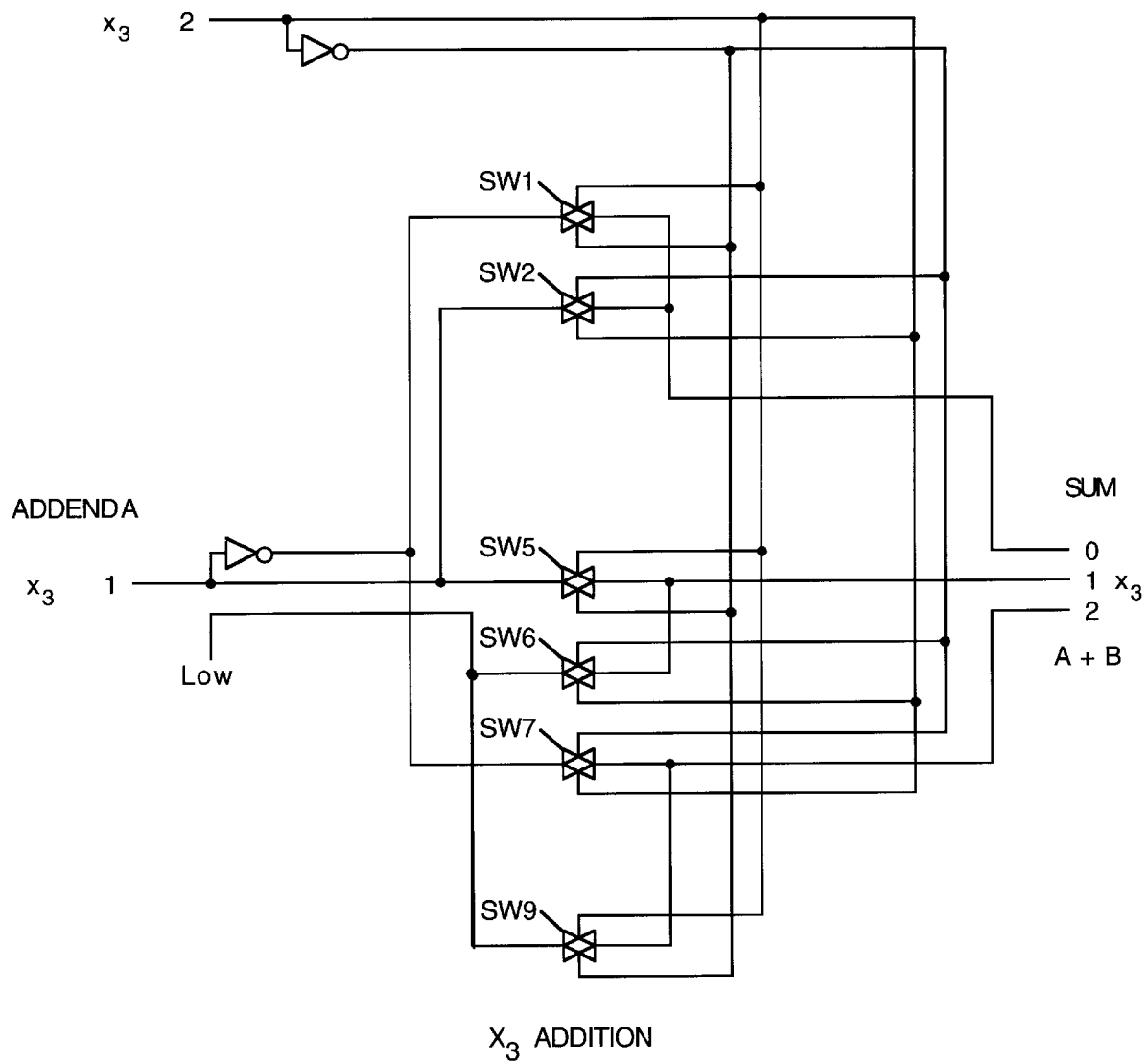
FIG. 13 is a circuit diagram illustrating available circuit simplifications, in this case an adder simplification, when the state of specific one-hot RNS input lines is predetermined.

In certain calculations in accordance with the present invention one-hot system, simplification of the generalized circuits may be achieved. By way of example, in the case of addition, subtraction, and multiplication involving a constant, applying the constant as the "B" input of the generalized circuits of FIGS. 2, 3 and 4 permanently sets the switches so that the switches can be eliminated in favor of no connections at all for the lines in which the switches would always be open and a hardwired line for the lines in which the switches would always be closed. This then reduces to transistorless addition, subtraction and multiplication functions in the form of simply renumbering of the lines. As a further example, consider the first adder in the binary to RNS converter of FIG. 11 for the $x_3$ RNS digit— the adder at the upper left of FIG. 11. Referring to FIG. 2 for the generalized $x_3$ adder, the number 1 line of the B addend is always low (see the adder at the upper left of FIG. 11). This means that switches SW3, SW4 and SW8 are always off, so that the switches and the lines thereto can be eliminated, as shown in FIG. 13. Also since the B addend input is a single binary bit representing 0 or 2, only the number 2 line and its inverse are needed, as the number 0 line is the inverse of the number 2 line and the number 2 line is the inverse of the number 0 line. Similarly, since the A addend input is also a single binary bit representing 0 or 1, only the number 1 line and its inverse are needed. This too is shown in FIG. 13.

Figure 14:
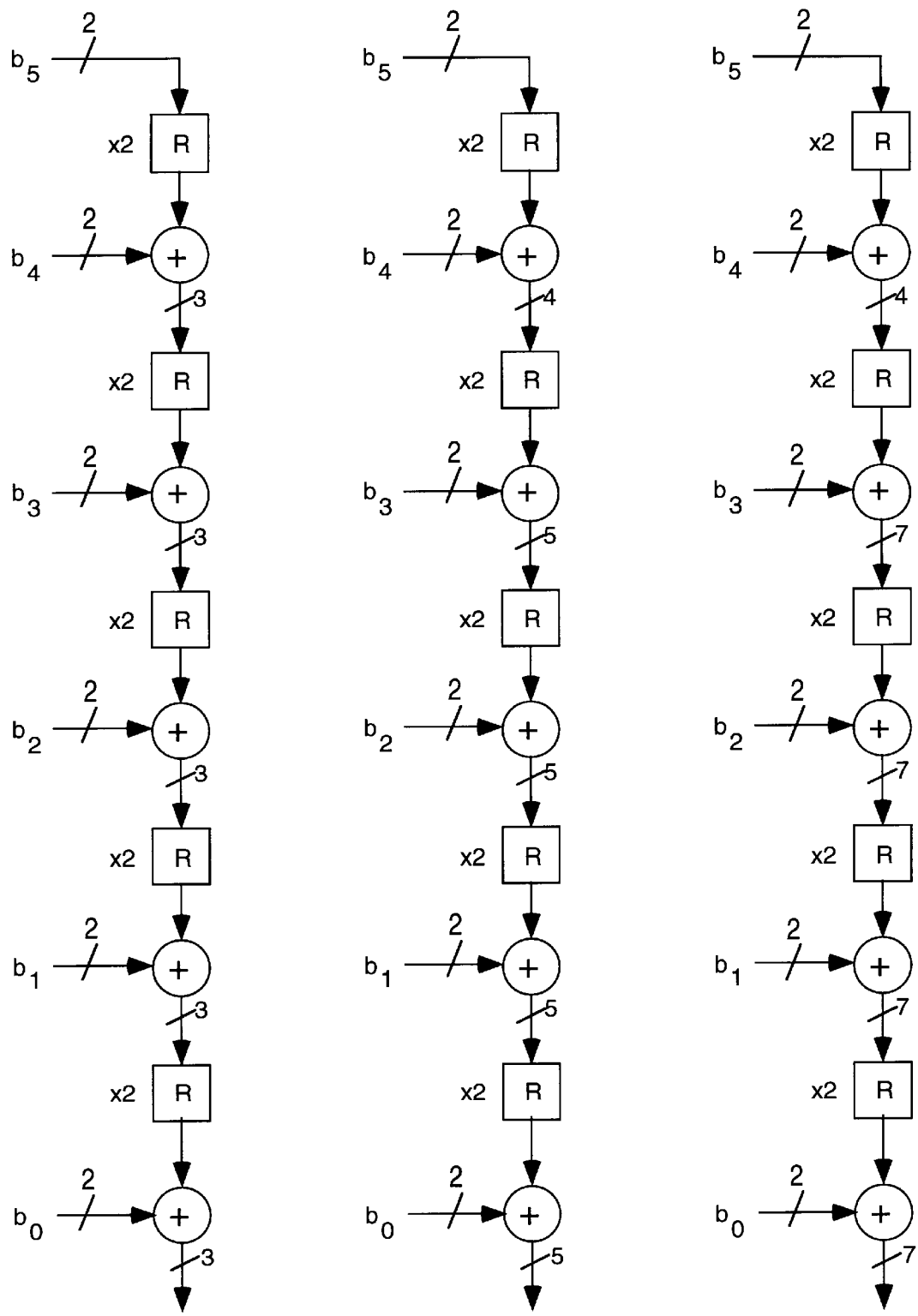
FIG. 14 is a block diagram for a circuit for the conversion of an unsigned binary number to a 3,5,7 one-hot RNS representation using a most significant bit first type circuit.

FIGS. 10 and 11 are basically a least significant bit first type circuit for binary to RNS conversion. FIG. 14 illustrates a most significant bit first circuit in block diagram form for binary to RNS conversion in accordance with the present invention. In this circuit, the value of each sum is multiplied by 2 before the value of the next most significant bit is added, etc. While the result is the same as for the circuits of FIGS. 10 and 11, the circuit of FIG. 14 may have a circuit layout advantage because of the replication of the fixed multipliers.

The foregoing conversion from binary to one-hot RNS representation was done without consideration of the possibility of negative numbers, and of how negative numbers might be represented in binary form. Typically the binary representations of the numbers to be converted to one-hot RNS representations in systems using the present invention will be in two's complement form. In this form, the most significant bit is the sign bit, 0 if positive and 1 if negative. If 0, then the remaining bits represent the magnitude of the number X in binary form. If the most significant bit is 1, then the remaining bits, after being inverted and then 1 being added thereto, represent the magnitude of the negative number X in binary form. Equivalently, if the most significant bit is 1, then the remaining bits give the magnitude above $-(2^{N-1})$.

Figure 15:
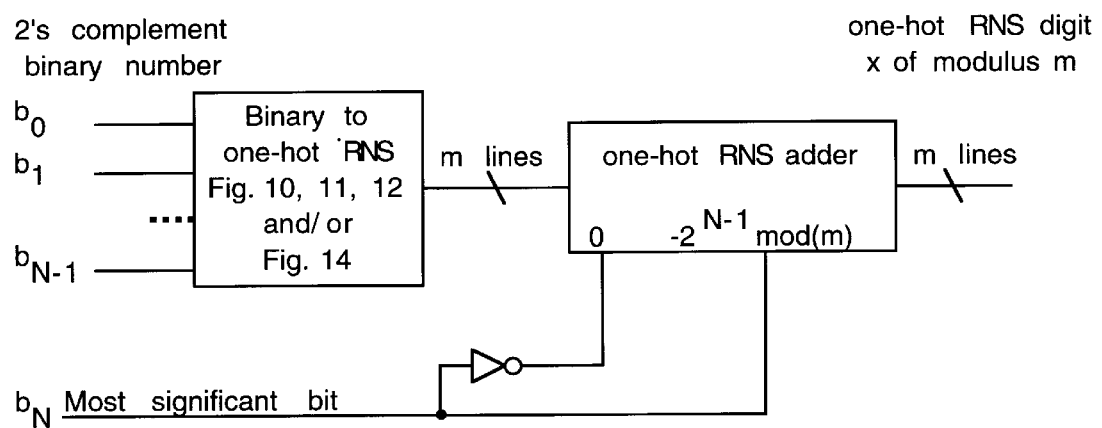
FIG. 15 is a block diagram for the conversion of a two's complement binary number to a one-hot RNS representation of that number.

The conversion of two's complement binary numbers representing positive numbers to one-hot RNS representation (most significant bit=0) can be achieved as shown in FIG. 10 and 11, or FIG. 14. A circuit for converting a two's complement binary representation of a number X, which includes negative numbers, to a one-hot RNS representation of the number X is shown in FIG. 15. This FIG. illustrates a direct implementation of the approach that if the most significant bit is 0, then the remaining bits represent the magnitude of the number X in binary form, but if the most significant bit is 1, then $-(2^{N-1})$ is added, so that the other bits give the magnitude above $-(2^{N-1})$.

As previously mentioned, some operations are difficult in an RNS system. The Associated Mixed Radix (AMR) conversion discussed in the prior art can be helpful in such operations. For instance, in an RNS system wherein positive and negative numbers are represented, the AMR representation may be used for the detection of the sign of a number X. In particular, consider the AMR digits $a_1, a_2, \ldots a_{N-1}, a_N$ in the AMR representation of a number X wherein $m_N=2$. The equation for X becomes:

$$X = a_1 + a_2 * m_1 + a_3 * (m_1 * m_2) + \ldots + a_{N-1} * (m_1 * m_2 * \ldots * m_{N-2}) + a_N * (m_1 * m_2 * \ldots * m_{N-2} * m_{N-1})$$

wherein: $a_N=0$ or $-1$, and $a_1$ through $a_{N-1}$ are zero or positive numbers only.

If $a_N=0$, then X is in the range of 0 to $((m_1 * m_2 * \ldots * m_{N-2} * m_{N-1}) - 1)$.

If $a_N=-1$, then X is in the range of $-(m_1 * m_2 * \ldots * m_{N-2} * m_{N-1})$ to $-1$.

The sign of X is indicated by the value of $a_N$, $a_N=0$ being plus and $a_N=-1$ being negative. (X=0 is considered positive, and if to be detected, can be detected by ANDing the zero lines of all one-hot RNS digits.) Consequently one can determine the sign of a number X expressed in a positive and negative RNS representation as follows:

1. A one-hot RNS digit of modulus 2 should be included in the initial one-hot representation of the number or numbers being processed.
2. Order the RNS digits so that the digit of modulus 2 is the last RNS digit and so is associated with the most significant AMR digit $a_N$.
3. Convert the RNS representation of the number X to the equivalent AMR representation of X, and
4. Determine the value of $a_N$ for determination of the sign of X, 0 for plus and $-1$ for negative. (A digit of even modulus above 2 can also be used instead of a digit of modulus 2, in which case the sign of X is positive if $a_N$ is 0 or positive, and the sign of X is negative if $a_N$ is negative.)

Figures 16A, 16B:
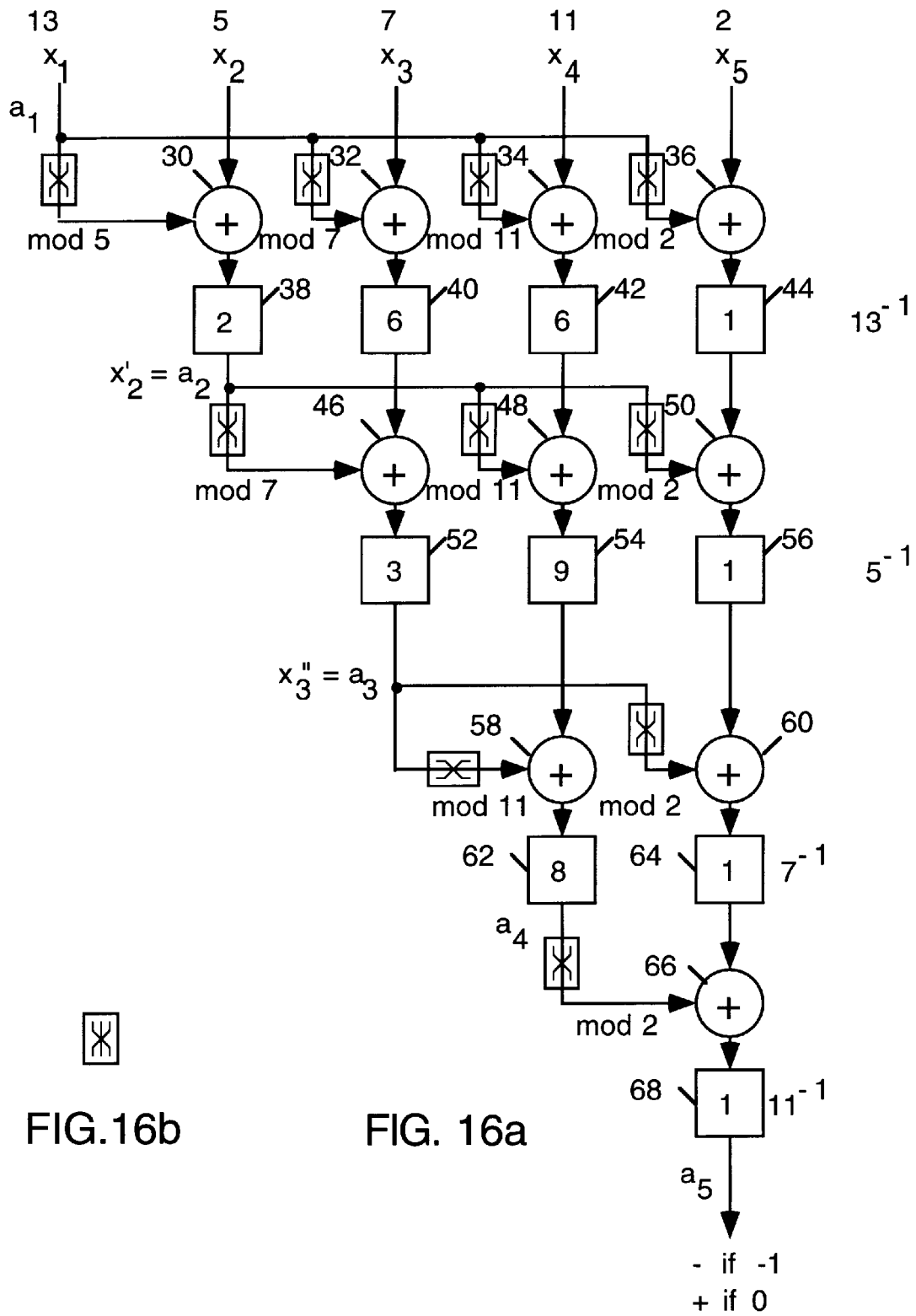
FIG. 16a is a block diagram for determining the sign of a number X expressed in a 13,5,7,11,2 one-hot RNS form.
FIG. 16b is a diagram of a symbol used in FIG. 16a to indicate a change in modulus (number of lines) of a value.

A circuit for establishing the AMR representation (in one-hot form) and for determining the sign of X in an exemplary one-hot RNS system having an RNS digit of modulus 2 is shown in FIG. 16a. For this circuit, a total of 10 adder/subtractors are involved. The first row of subtraction circuits 30, 32, 34 and 36 forms $X-a_1$, where $a_1$ is the first AMR digit, associated with mod (13) and equal to $x_1$ of the RNS number. In the one-hot system, the x1 input is a 13 line input ($x_1$ lines 0 through 12), the $x_2$ input is a 5 line input ($x_2$ lines 0 through 4), the $x_3$ input is a 7 line input ($x_3$ lines 0 through 6), the $x_4$ input is a 11 line input ($x_4$ lines 0 through 10), and the $x_5$ input is a 2 line input ($x_5$ lines 0 and 1). Since the subtraction circuits 30, 32, 34 and 36 are modulo 5, modulo 7, modulo 11 and modulo 2 subtraction circuits, though $a_1$ can range from 0 to 12, $a_1$ modulo 5, $a_1$ modulo 7, $a_1$ modulo 11 and $a_1$ modulo 2 must be determined. This is a remapping of lines as in Table 9 below.

TABLE 9

| | $a_1$ mod( ) | | | |
|---|---|---|---|---|
| $a_1$ line high | $x_2$ line high | $x_3$ line high | $x_4$ line high | x5 line high |
| 0 | 0 | 0 | 0 | 0 |
| 1 | 1 | 1 | 1 | 1 |
| 2 | 2 | 2 | 2 | 0 |
| 3 | 3 | 3 | 3 | 1 |
| 4 | 4 | 4 | 4 | 0 |
| 5 | 0 | 5 | 5 | 1 |
| 6 | 1 | 6 | 6 | 0 |
| 7 | 2 | 0 | 7 | 1 |
| 8 | 3 | 1 | 8 | 0 |
| 9 | 4 | 2 | 9 | 1 |
| 10 | 0 | 3 | 10 | 0 |
| 11 | 1 | 4 | 0 | 1 |
| 12 | 2 | 5 | 1 | 0 |

Figure 17:
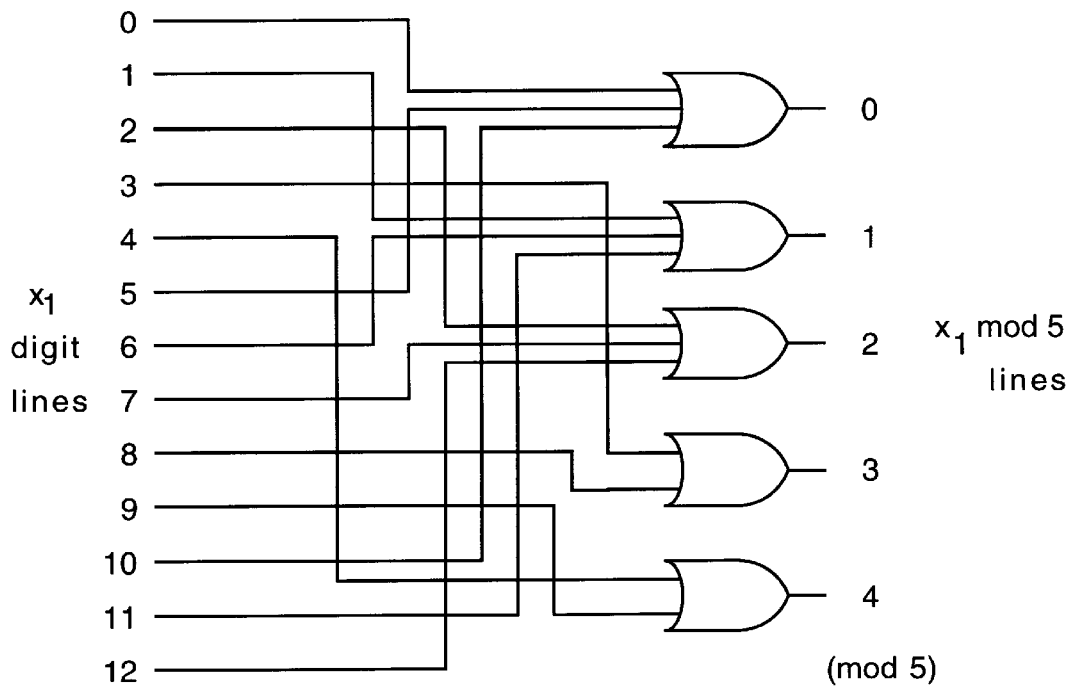
Figure 18:
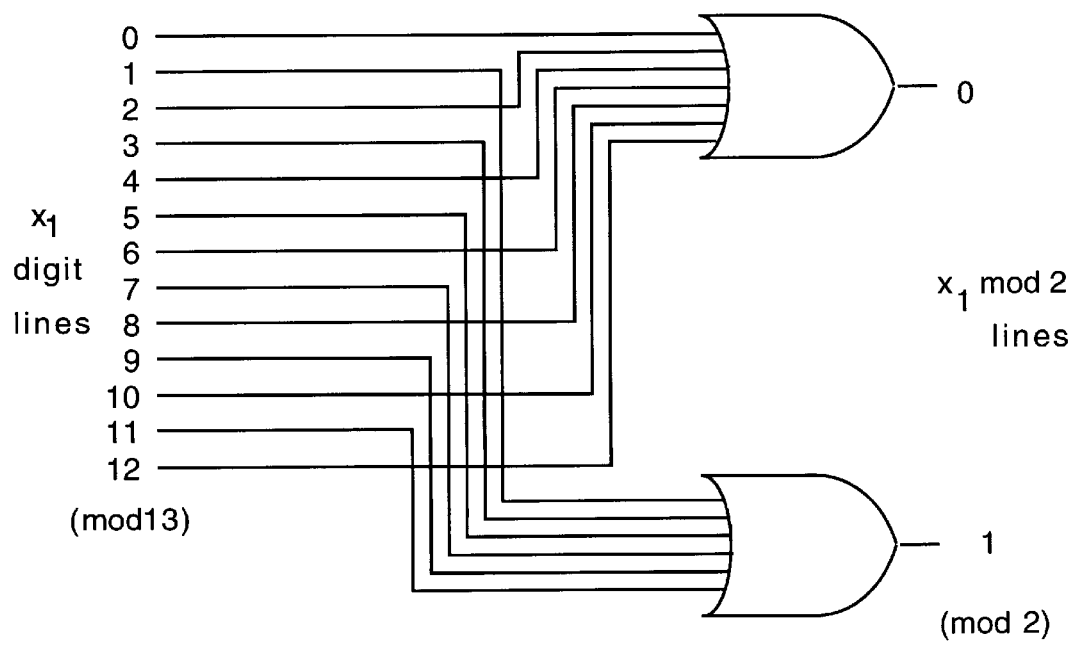

A specific circuit for determining the five inputs for the subtractor 30 of FIG. 16a is shown in FIG. 17, and for the two inputs of subtractor 36 in FIG. 18. Similar detailed circuits for the inputs for the other adder/subtractors using OR gates or equivalent are easily derived from Table 9. Circuits of this general type for converting a one-hot RNS signal of one modulus to a one-hot RNS signal of a smaller modulus in FIG. 16a are indicated by the symbol shown in FIG. 16b. The output of the subtractor 30, 32, 34 and 36 are $X-a_1$ in one-hot RNS form. Note that subtraction of the value of the $x_1$ digit from the RNS number reduces the value of this RNS digit to zero. This means that the value of the resultant RNS number is now divisible by 13. The $x_1$ digit is dropped in the following division because, as discussed in the prior art section, its value after the division cannot be known.

Figure 19A:
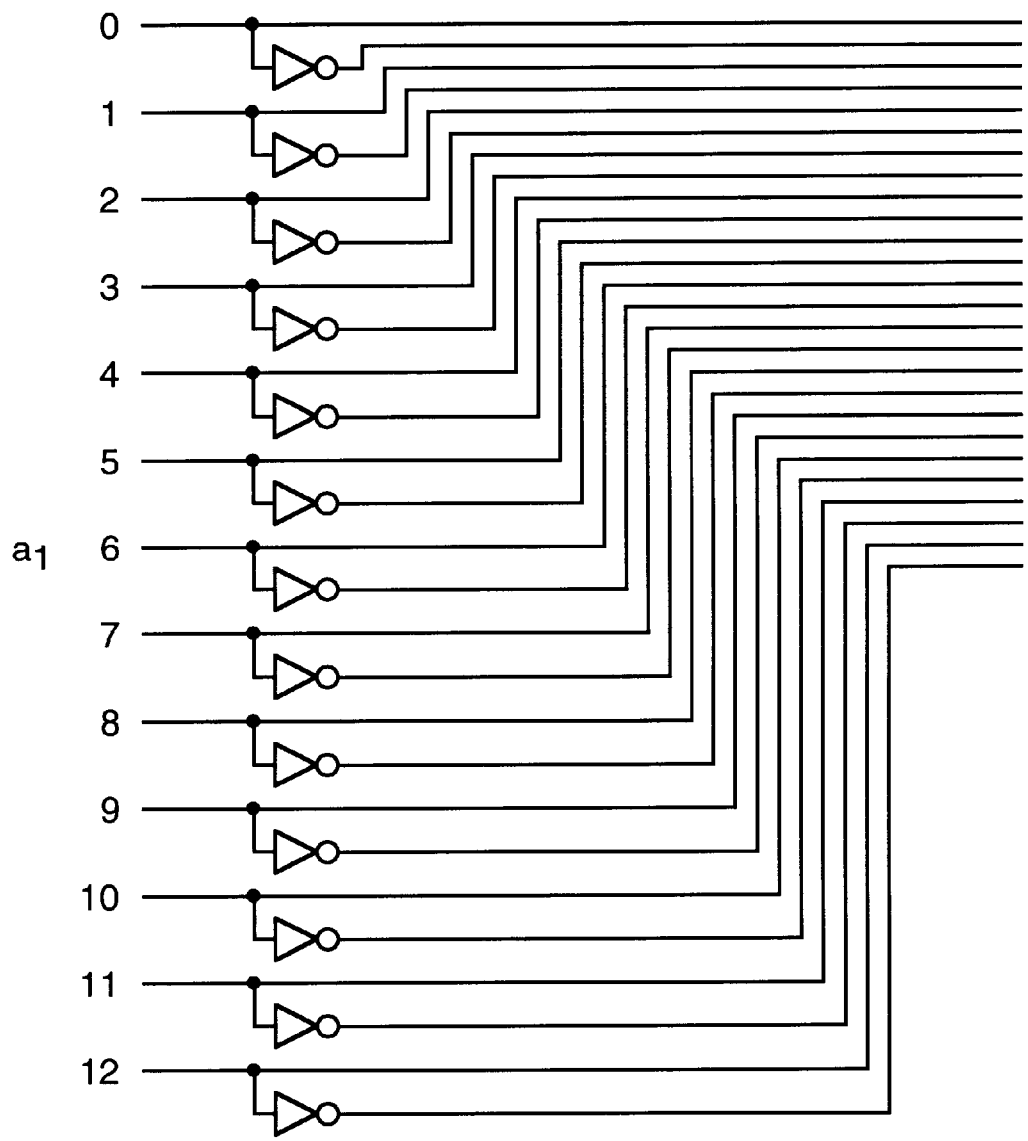
FIGS. 19a and 19b illustrate the concatenation of the circuit of FIG. 17 and subtractor 30 of FIG. 16a for line 0, and FIGS. 19a and 19c for line 1, of $x_2-a_1$ mod(5).
Figure 19B:
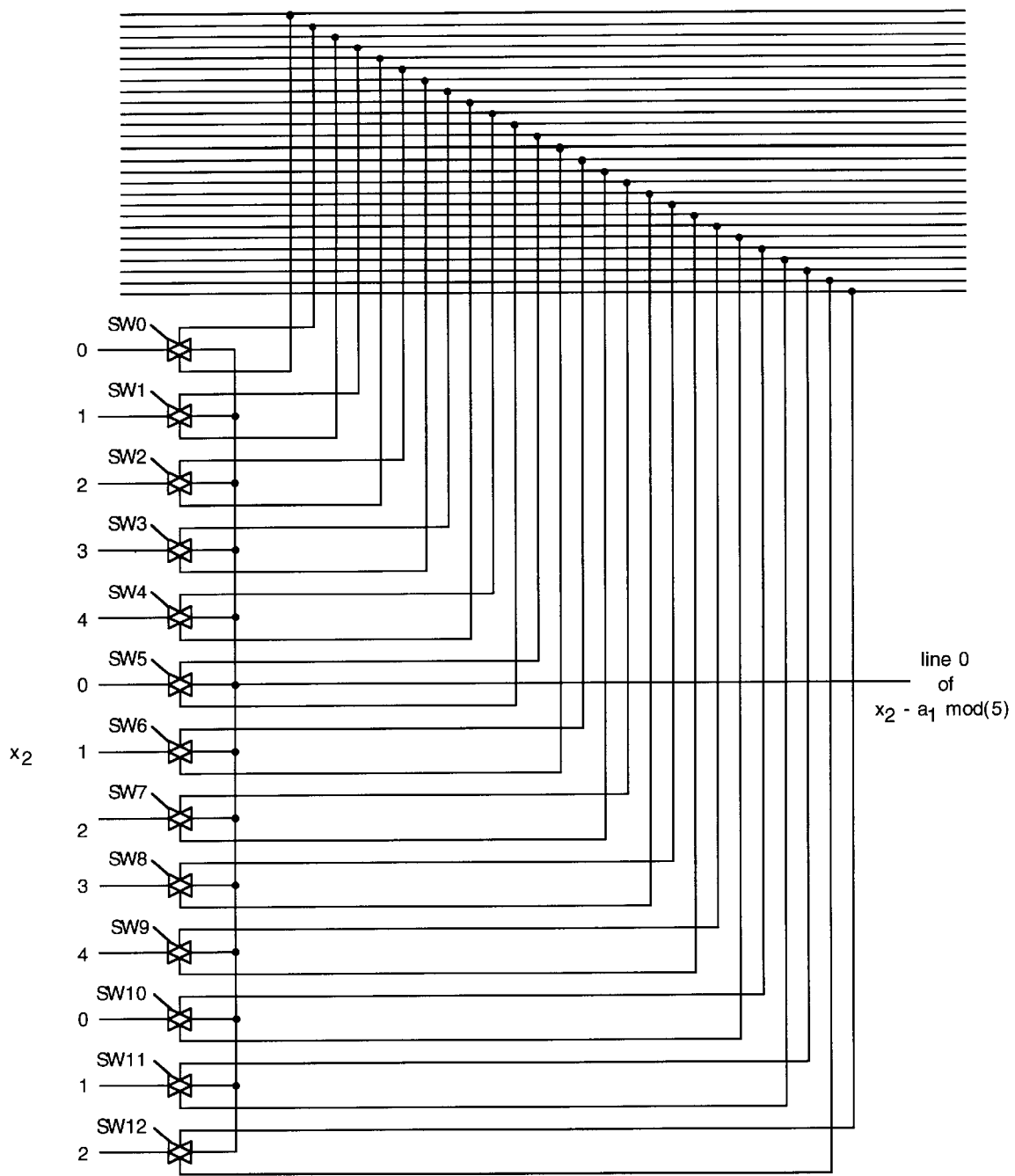
Figure 19C:
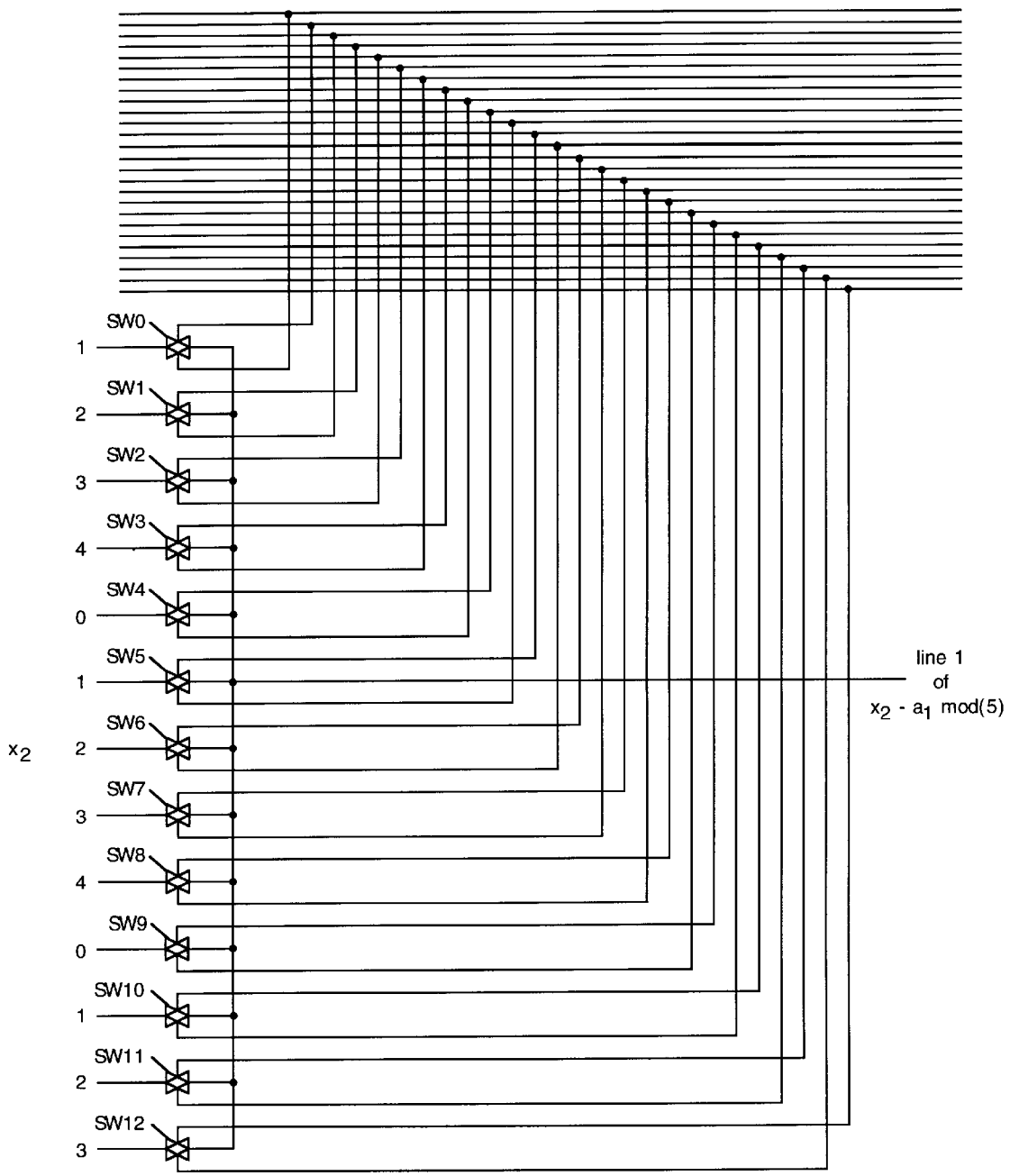

The circuits of FIGS. 17 and 18 achieve the desired modulus conversion, but inject a switching (gating) delay, as do the subtractors which immediately follow the change in modulus. One of these two delays may be eliminated by combining these two functions. For instance, the circuit of FIG. 17 can be combined with the subtractor as shown in FIGS. 19a and 19b for output line 0 and FIGS. 19a and 19c for output line 1 of $x_2-a_1$ mod(5). Here all 13 lines of the mod(13) signal are used as the input to the subtractor 30, with the output of the 13 switches being combined to provide the mod(5) result.

To find $X'=(X-a_1)/m_1$, one needs to divide by $m_1$, or alternatively, to multiply by the multiplicative inverse of $m_1$.

The multiplicative inverses used in FIG. 16a are listed in Table 10 below.

TABLE 10

|  | Modulus of digit | | | |
| --- | --- | --- | --- | --- |
|  | 5 | 7 | 11 | 2 |
| $13^{-1}$ | 2 | 6 | 6 | 1 |
| $5^{-1}$ |  | 3 | 9 | 1 |
| $7^{-1}$ |  |  | 8 | 1 |
| $11^{-1}$ |  |  |  | 1 |

Multiplication by a constant, including multiplicative inverses, is as previously shown, merely a renaming (typically a rerouting also) of the lines. This is indicated by the multiplication (renaming or rerouting) circuits 38, 40, 42 and 44 (as well as the other multiplication circuits represented by the square boxes) of FIG. 16a. Now that X' is known, $a_2 = x_2'$.

To find $X'' = (X' - a_2)/m_2$, the next row of subtractors 46, 48 and 50 subtract the value of $a_2$ from the remaining three RNS digits. Since the $x_2$ digit has a modulus smaller than the moduli of the next two digits, $a_2$ can be subtracted directly from the next two digits by an RNS subtractor by tying any additional lines required to ground (low) as shown in Table 11 below. Circuits of this general type for converting a one-hot RNS signal of one modulus to a one-hot RNS signal of a larger modulus in FIG. 16a are also indicated by the symbol shown in FIG. 16b.

TABLE 11

| line numbers | $a_2$ lines | $x_3$ lines | $x_4$ lines | $x_5$ lines |
| --- | --- | --- | --- | --- |
| 0 | 0 | 0 | 0 | 0 |
| 1 | 1 | 1 | 1 | 1 |
| 2 | 2 | 2 | 2 | 0 |
| 3 | 3 | 3 | 3 | 1 |
| 4 | 4 | 4 | 4 | 0 |
| 5 |  | low | low |  |
| 6 |  | low | low |  |
| 7 |  |  | low |  |
| 8 |  |  | low |  |
| 9 |  |  | low |  |
| 10 |  |  | low |  |

Note again, a number of lines of one input to the subtractors are always low. If these inputs are used as the B inputs to the subtractors (see FIG. 3), the subtractor circuits can be substantially simplified because the corresponding switches of the subtractor are always off, allowing the elimination of all such switches and all lines to and from such switches.

The output of the subtractors 46, 48 and 50 are an $x_3, x_4, x_5$ RNS representation of the natural number X as rounded down as necessary and divided by 13 and as further rounded down as necessary to be further divisible by the natural number 5. Again the subtraction of the value of $a_2$ from the remaining one-hot RNS digits has reduced the value of the $x_2$ RNS digit to zero. The $x_2$ digit is again dropped. The division by 5 is now accomplished by multiplying by the multiplicative inverses of 5, or $5^{-1}$ by the renaming of lines in multipliers 52, 54 and 56.

$a_4$ may be found by subtracting $a_3$ from the other two RNS digits and then multiplying by $7^{-1}$ as follows. Since the modulus of $a_3$ (7) is smaller than the modulus of the $a_4$ (11), the 7 lines of $a_3$ may be applied to adder/subtractor 58 directly while the last input lines of the $a_3$ input of adder/subtractor 58 are held low. For the corresponding input to adder/subtractor 60, the one-hot lines for $a_3$, 0 through 6, may first be ORed in a manner similar to that shown in FIG. 18 to bring the 7 lines to a mod(2) signal (2 lines), or logically equivalent, additional switches could be added to the adder/subtractor. The result of the subtraction is then multiplied by the multiplicative inverses $7^{-1}$ by multipliers 62 and 64 to provide $a_4$ which, when converted to modulo 2, subtracted from the output of multiplier 64 by adder/subtractor 66 and multiplied by the multiplicative inverse $11^{-1}$ by multiplier 68, provides $a_5$. Note, however, that $x_5$ ranges from 0 to 1, whereas $a_5$ ranges from −1 to 0. Thus, the one-hot 0 line of $a_5$ is interpreted as the one-hot zero line, whereas the second $a_5$ line is really the −1 one-hot line of $a_5$.

The circuit of FIG. 16a as well as other circuits realized in accordance with the present invention may provide an undesired delay because of the series of operations occurring, acceptable at low clock rates, but limiting if high clock rates are required. Accordingly, in this and other circuits, it may be desirable to provide one or more levels of pipelining to allow operation at much higher clock rates.

Now consider the problem of scaling in the RNS one-hot system of the present invention. Scaling involves the division of a number X by a constant, and in the preferred embodiment of the present invention, is based on the application of AMR representations of the numbers involved. As described above, the determination of the AMR digits of an AMR representation of a number from its one-hot RNS representation uses the division, in one-hot RNS form, of various terms by the respective moduli ($X' = (X - a_1)/m_1$, $X'' = (X' - a_2)/m_2$, etc.), division in the one-hot RNS system of the present invention having been previously described.

There are two possible scaling factors: either the factor is equal to one of the moduli (or the product of two or more moduli) in the RNS system, or it's not. If it is not equal to a modulus (or the product of two or more moduli), there is no way of knowing ahead of time how much to round the RNS number to make it divisible by the scaling factor. Thus, a modulus (or two or more moduli) must be created equal to the scaling factor to determine the rounding factor. As an example, if it is desired to scale down (divide) by 4, first find the value of the natural number modulo 4 (a new RNS digit) and subtract the remainder (the value of the new digit) 0, 1, 2, or 3 from each RNS digit to get the respective natural number to an integer multiple of 4.

If the scaling factor is equal to an existing modulus, then the rounding factor is known. Once rounded, the value of the RNS digit equal to the rounding factor becomes zero. This digit will disappear after the division. Even though the value of the RNS digit equal to the rounding factor becomes zero and effectively disappears, division can proceed on the other moduli and the answer will be correct and unique, since although the dynamic range has been reduced by the scaling factor, the dynamic range of the scaled number has been reduced by the same amount and fits in the new RNS range. Now recreating the modulus that disappeared can restore the original dynamic range.

In either case the key to the division problem is to create another RNS digit from the existing (or remaining) RNS digits, either; (1) before division if the divisor is not equal to a preexisting modulus or a product of two or more moduli to be able to round the natural number up or down to assure that the divisor divides evenly into the dividend, or (2), after division if the divisor is equal to a preexisting modulus or a product of two or more moduli to recreate the modulus or moduli lost in the division. This is done using a method called "Base Extension" previously described in the prior art section, not now unique in itself, but unique when used in conjunction with the one-hot RNS system of the present invention.

Figure 20:
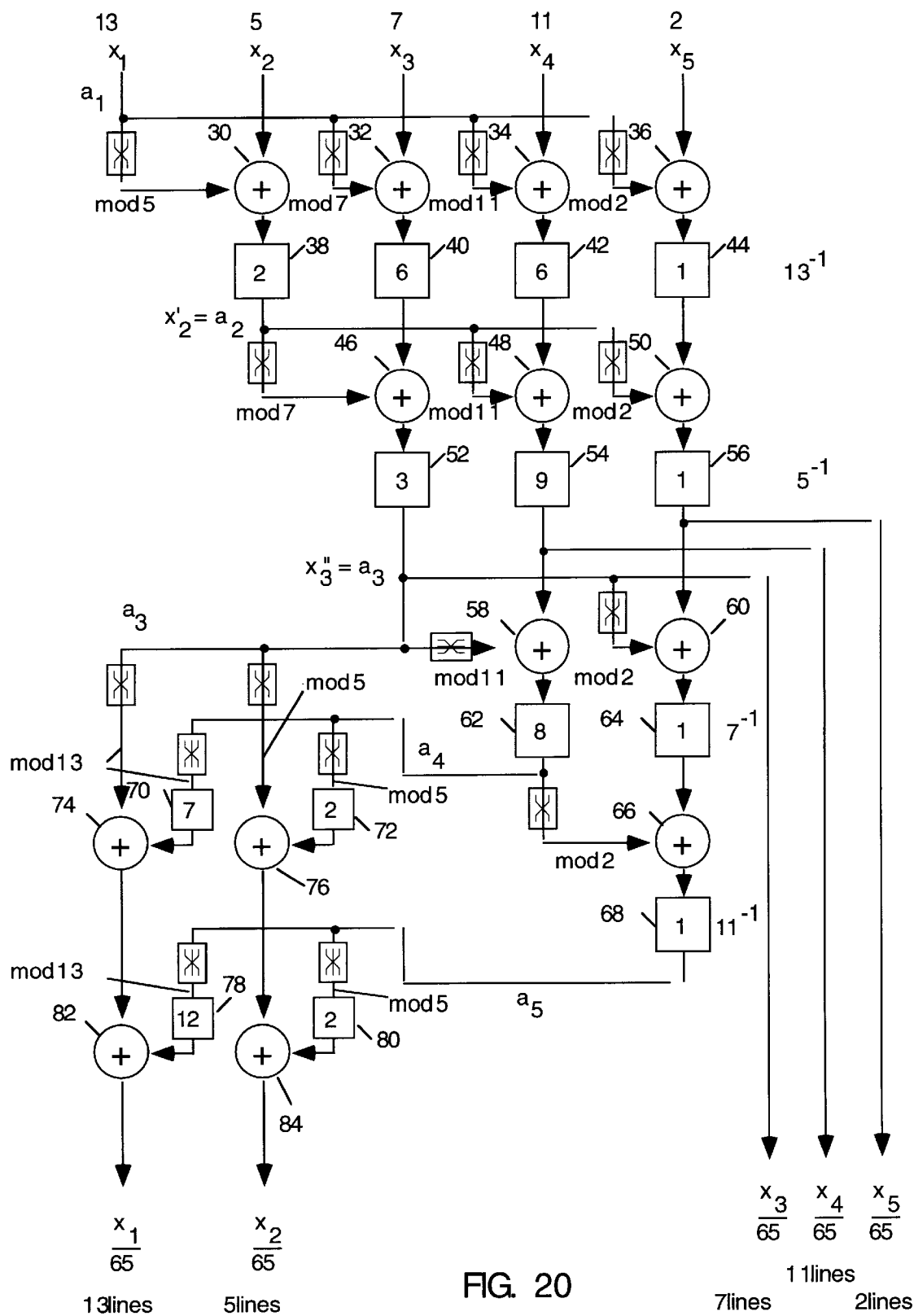
FIG. 20 is a block diagram for a scaler and for the recreation of the RNS digits lost in the scaling in a one-hot RNS system.

FIG. 20 presents a circuit in block diagram form for a scaler in a 13,5,7,11,2 RNS system, where the scale factor is 5*13=65. The circuit of FIG. 20 eliminates the moduli 5 and 13 digits, and also recreates these digits to reestablish the full range of the 13,5,7,11,2 RNS system. The remaining three RNS digits of the result are available as the outputs of multipliers 52, 54 and 56. The circuit of FIG. 20 is similar to the circuit of FIG. 16$a$, and is used to find $a_1$ through $a_5$ of the AMR representation of the number.

Now having $a_3$, $a_4$ and $a_5$, the foregoing equations are used to recreate $x_1/65$ and $x_2/65$ lost in the scaling:

$$x_1/65 = ((a_3) \mod(13) + (a_4*7) \mod(13) + (a_5*7*11) \mod(13)) \mod(13)$$

$$x_2/65 = ((a_3) \mod(5) + (a_4*7) \mod(5) + (a_5*7*11) \mod(5)) \mod(5)$$

$a_3 \mod(13)$ in one-hot form is provided as one input to adder/subtractor 74, the other input of adder/subtractor 74 being $a_4 \mod(13)$ multiplied by 7. $a_4$ may have one-hot RNS values ranging from 0 to 10, which when multiplied by 7, gives values ranging from 0 to 70 mod(13) as the respective input to adder/subtractor 74. The remaining one-hot lines for the input to adder/subtractor 74 are tied low. For the respective input to adder/subtractor 76, note that $(a_4*7) \mod(5) = (a_4*5) + \mod(5) + (a_4*2) \mod(5) = (a_4*2) \mod(5)$. Thus $a_4$ is multiplied by 2 by multiplier 72. Also the conversion of $a_4$ from a mod(11) one-hot RNS signal to a mod(5) one-hot RNS signal may be done using a circuit similar to those shown in FIGS. 17 and 18.

To complete the recreation of the RNS digits lost in dividing by 65, the outputs of adder/subtractors 74 and 76, representing $(a_3) \mod(13) + (a_4*7) \mod(13)$ and $(a_3) \mod(5) + (a_4*7) \mod(5)$, are coupled to one input of adder/subtractors 82 and 84 respectively, with the second inputs to the adder/subtractors being $(a_5*7*11) \mod(13)$ and $(a_5*7*11) \mod(5)$. Care must be taken to properly interpret $a_5$, depending on the range of X. In the first interpretation (positive range of X only), as can have values of 0 or +1. Here $a_5 \mod(5)$ and $a_5 \mod(13)$ are both equal to $a_5$, or 0 or +1 respectively. In the second interpretation, wherein X has both positive and negative values, $a_5$ can have values of 0 and −1. Now $a_5 \mod(5)$ and $a_5 \mod(13)$ is 0 if $a_5$ is 0, but if $a_5$ is −1, then $a_5 \mod(5)$ is 4 and $a_5 \mod(13)$ is 12. Thus the renaming of the 2 one-hot RNS lines for $a_5$ prior to inputting the same to multipliers 78 and 80 is different for the cases where X has a positive range only and where X has a positive and negative range.

Finally, for the value to multiply by in multipliers 78 and 80, note that $(a_5*7*11) \mod(13) = (a_5*77) \mod(13) = (a_5*65) \mod(13) + (a_5*12) \mod(13) = (a_5*12) \mod(13)$, and $(a_5*7*11) \mod(5) = (a_5*77) \mod(5) = (a_5*75) \mod(5) + (a_5*2) \mod(5) = (a_5*2) \mod(5)$.

Thus the output of adder/subtractors 82 and 84, already modulo 13 and 5 respectively, are $x_1/65$ and $x_2/65$.

Having now described various basic operations in the present invention one-hot RNS system, it will be apparent that other operations may be executed using combinations of the operations described. For instance, the absolute value of X in one-hot RNS form may be found by first determining if X is positive or negative as already described, and if negative, multiplying X by −1, again in one-hot RNS form. Similarly, to compare two numbers X and Y in one-hot RNS form, the two numbers X and Y may be subtracted in one-hot RNS form and then the sign of the difference (X−Y) may be determined as previously described, and/or a zero result detected by detection of all "0" lines of the one-hot RNS representation of the result being high.

In most cases, after processing a digital signal or digital information in the one-hot RNS system of the present invention, it will be desired to return to a binary system for further information processing, storage or transmission to other hardware or a relatively remote location. Also, there may be instances wherein it is preferable to do certain processing in the one-hot RNS system of the present invention, convert to binary for one or more operations and reconvert to the one-hot RNS system of the present invention for further processing.

To convert from the one-hot RNS system of the present invention to binary, the one-hot RNS representation of a number X is used to determine, still in a one-hot system, the values of $a_n$ in the AMR representation of X:

$$X = a_1 + a_2*m_1 + a_3*(m_1*m_2) + \ldots + a_{N-1}*(m_1*m_2* \ldots *m_{N-2}) + a_N*(m_1*m_2* \ldots *m_{N-2}*m_{N-1})$$

While the various values of $a_n$ are variables, the moduli are all predetermined (known). Thus the equation for X becomes:

$$X = a_1 + a_2*c_1 + a_3*c_2 + \ldots + a_{N-1}*c_{N-2} + a_N*c_{N-1}$$

where: $c_1$, $c_2$, etc. are predetermined (known) constants

The determination of the various values of $a_n$ in one-hot form from a one-hot RNS representation of a number has already been described with respect to FIG. 16$a$. Given the various values of $a_n$ in one-hot form, note that they are equivalent to fully decoded values of binary representations of $a_n$. As such, a very convenient way of finally converting to binary is to use each value of $a_n$ in one-hot form as a decoded address to enter an associated lookup table (LUT) on chip (which may be a ROM), each programmed to output $a_n*c_{n-1}$ in binary form when addressed with $a_n$. These outputs are added together with a standard binary adder. This is illustrated in FIG. 21.

Figure 21:
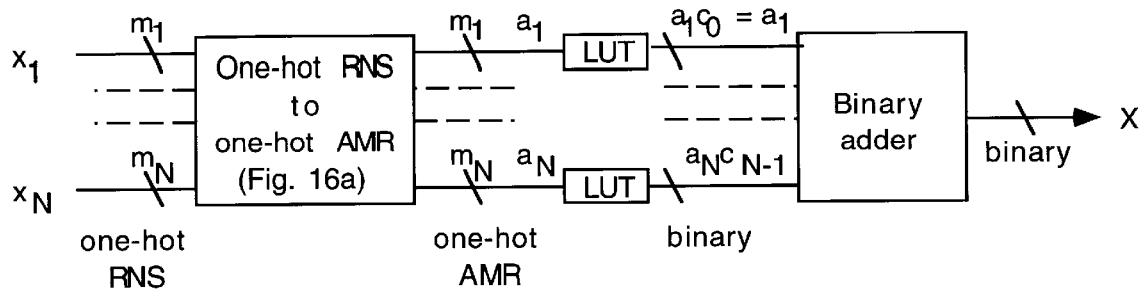
FIG. 21 is a block diagram for an exemplary circuit for the conversion of a number X expressed in one-hot RNS form to a binary representation of the number X.

With respect to FIG. 21 and the related equations, note that the number of entries (addresses) needed for each lookup table (LUT) depends on the associated value of the modulus in the one-hot RNS representation of X, but in any event each lookup table will be relatively small. Also note that $c_0=1$ will be the lowest or smallest constant, whereas $c_{N-1}$ will be the largest. While the maximum possible values of each of the variables $a_1$ through $a_N$ will depend on the respective moduli in the one-hot RNS system, $a_N*c_{N-1}$ will be much larger than $a_1$, so that the Lookup table output for $a_N*c_{N-1}$ will be much wider (more bits) than for $a_1$. Still, the width of the required output for the widest lookup table output will be quite reasonable, as is the required width of the binary adder (or cascaded adders), so that full width lookup tables and binary adder is preferred for speed, even though the output of the binary adder may then be read out in other than full parallel form, such as bit or byte serial form. By way of example, in the 13,5,7,11,2 RNS system used with respect to the explanation of FIG. 16$a$, the total range of the system is 13*5*7*11*2=10,010 decimal. In binary form, this only requires an adder 13 bits wide plus a carry bit. Assuming an all positive range, the Nth lookup table would need to accommodate, in binary form, an output of 13*5*7*11=5005, which would require a binary output width of 13 bits, though only require two entries, 0 and +5005 in binary form (1001110001101). Assuming a positive and negative range, then the Nth lookup table would need to accommodate 0 and −5005 in 14 bit two's complement binary form (10110001110011).

In many applications of the present invention, the potential accuracy of the result exceeds that needed when returning to binary form. Therefore, expressing X in the AMR representation form:

$$X = a_1 + \ldots + a_n{}^* c_{n-1} + \ldots + a_N{}^* c_{N-1},$$

only the terms from some value of n>1 in the AMR representation of X need be included in the conversion to the binary representation of X. This too can be determined at design time.

Figure 22:
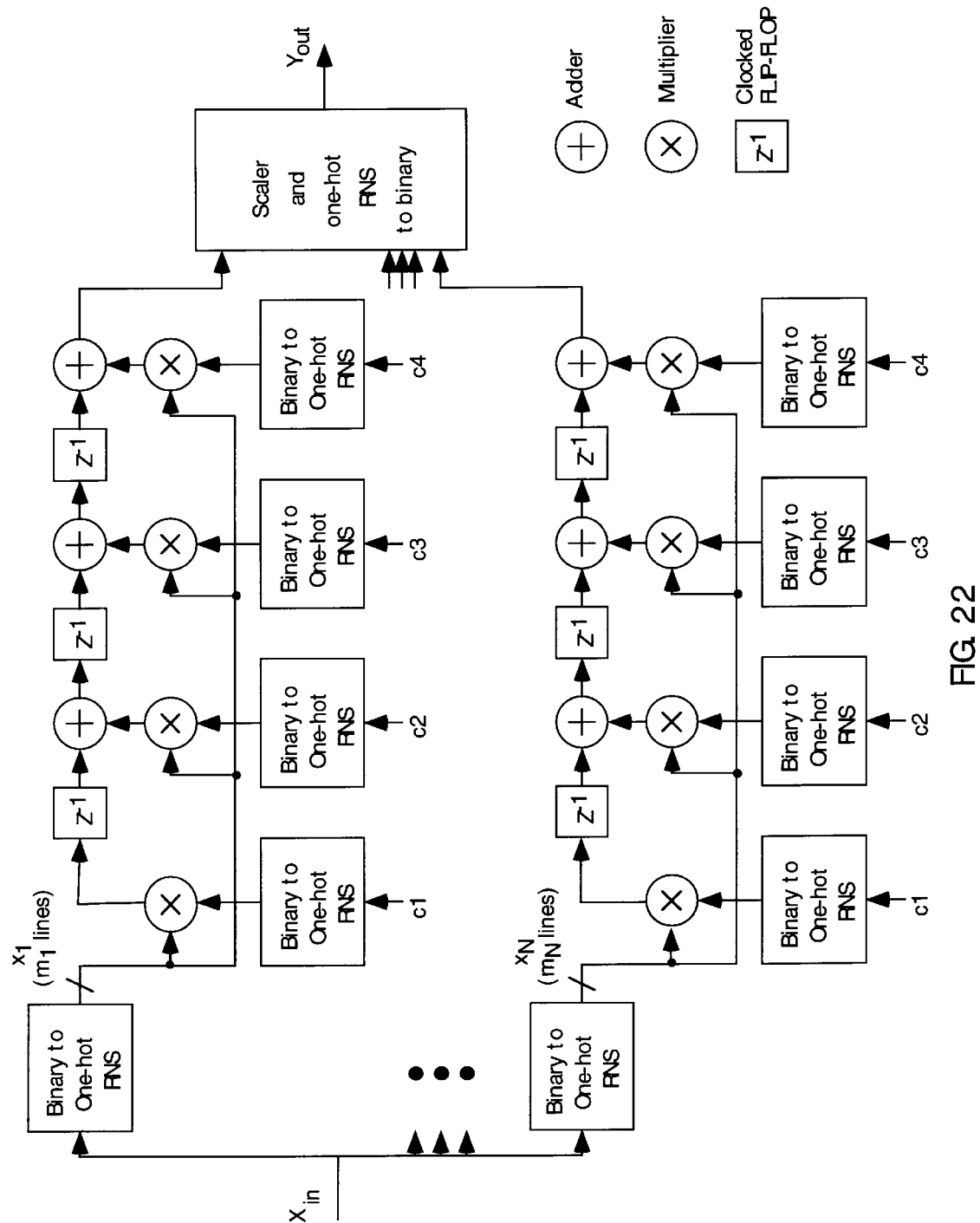
FIG. 22 illustrates a 4-tap finite impulse response (FIR) filter with binary input and binary output and with a one-hot RNS interior.

Having now described various elements of the present invention one-hot RNS system and how to convert binary signals to and from the present invention one-hot RNS system, an exemplary typical application will be described. FIG. 22 illustrates a 4-tap finite impulse response (FIR) filter with binary input and binary output, but with a one-hot RNS interior. The various elements of the diagram are labeled at the lower right of the Figure. While each RNS digit processing leg is comprised of the same elements (binary to one-hot RNS converters for the filter input and coefficients, multipliers, and adders), the corresponding detailed one-hot RNS circuits are not identical, in that each leg is for a different one-hot RNS digit, and thus is of a different modulus (different numbers of one-hot lines). The equation for the response of the filter of FIG. 22 is:

$$Y_{out} = (c_4 + c_3{}^* Z^{-1} + c_2{}^* Z^{-2} + c_1{}^* Z^{-3}) X_{in}$$

In a preferred embodiment of the filter of FIG. 22, the binary input $X_{in}$ is a 6 bit binary signal, the binary output $Y_{out}$ is an 8 bit binary signal, and the coefficients $c_1$ through $c_4$ are 6 bits, with the internal one-hot RNS circuits operating on a 2,5,7,11,13 RNS system.

The filter of FIG. 22 is merely one type of digital signal processing that may be efficiently and rapidly achieved with a minimum of power dissipated because of the very limited number of signal transitions for a given computation and the absence of multiple transitions because of ripple-through typical of binary adders in addition, subtraction and multiplication operations. It should be noted that, depending on the function (degree of complication) of the device realized in the one-hot RNS system on the present invention, line drivers may be required or desirable at one or more locations along a particular line, and/or some level of pipelining may be preferable to break up line capacitances and other sources of delay, and thereby allow higher clock speeds if needed.

Note that in the exemplary filter of FIG. 22, the output is converted back to binary form. In some applications, subsequent signal processing may be in one-hot RNS form also, in which case the one-hot RNS filter output lines may be coupled directly to the next one-hot RNS signal processing circuitry. Also, while the exemplary filter scales the result once after all filter processing is complete, other applications may advantageously use scaling at one or more intermediate steps in the signal processing. In the exemplary circuitry disclosed herein, certain operations have been shown in detail, though it is to be recognized that various equivalent forms may readily be derived using mathematical identities or alternate sequences or operations.

While an FIR filter has been used herein as an exemplary application of the present invention one-hot RNS system, many other devices can also be realized in the one-hot RNS system of the present invention, such as modulation, demodulation, signal detection, including most if not all functions now commonly achieved by conventional digital signal processors (DSPs). Also, while conversion from binary to the one-hot RNS system of the present invention has been described herein, it should be noted that other methods and apparatus for providing the one-hot RNS input signals may be used such as, by way of example, a special analog to digital converter for converting an analog signal directly to its one-hot RNS representation.

Another example of the application of the concepts disclosed herein relates to digital communications. In this field, digital information can be transmitted by signals with pulses representing digital "1's" and absence of pulses representing digital "0's". The pulses themselves are generally continuous-time in nature. While ideally the duration of a pulse representing a digital "1" is short, it is often the case that the duration is longer than the time allotted for the digital bit. The pulse then interferes with the detection of the value ("0" or "1") of neighboring bits in the digital sequence. This effect is known as inter-symbol interference (ISI). While undesirable in itself, ISI is often introduced intentionally into a digital communications channel for bandwidth efficiency and other economic considerations. It is left to the receiving system to unravel its confounding effects.

The receiving system can use digital signal processing to address the ISI problem. In such a system, the received signal is sampled and digitized by an analog-to-digital converter. The sampling rate is typically equal to the bit rate. The resulting sampled-data sequence also exhibits ISI. That is, the continuous-time pulse representing a digital "1" results in a sampled-data pulse, and the duration of the sampled-data pulse is longer than one bit time and so interferes with the detection of neighboring bits.

A sampled-data "equalizing" filter can be placed in the signal path in order to confine the duration of a pulse to a single bit time. An FIR filter such as that previously described could be used in this application. However, it is well known in the field of digital communications that such an approach is not optimal in terms of the error rate in the presence of noise (due to the amplification of high frequency noise). An alternative solution uses a "Decision Feedback Equalizer" (DFE), which although still not optimal, is attractive due to its simplicity. Its performance is superior to that of the equalizing filter.

Figure 23:
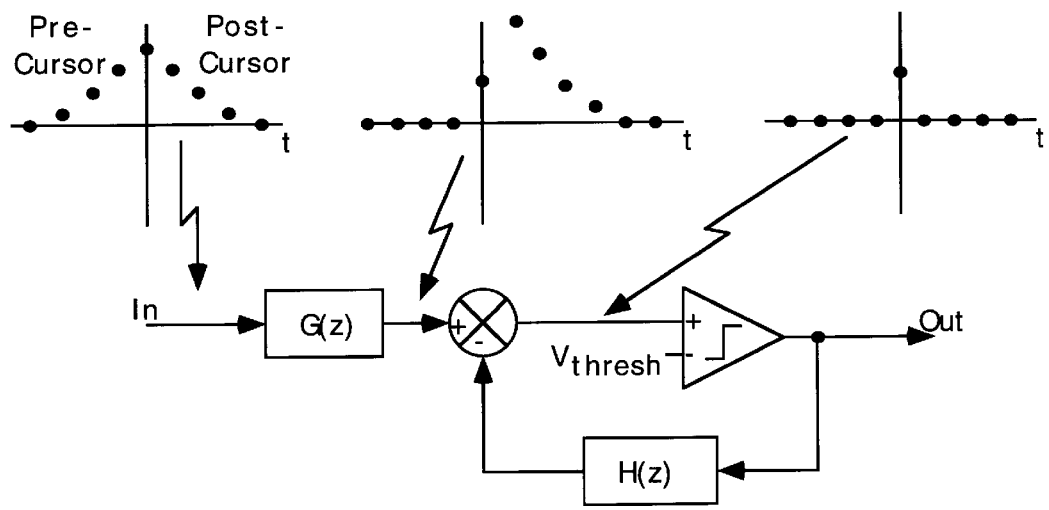
FIG. 23 is a block diagram of a Decision Feedback Equalizer (DFE).

FIG. 23 shows a block diagram of a DFE. Two FIR filters and a comparator are included. The filters are denoted as G(z) and H(z). The sampled-data input pulse exhibits ISI, which is divided into two components: The "precursor" ISI and the "postcursor" ISI. The FIR filter G(z) is included to remove the precursor ISI. In contrast to the equalizing filter discussed above, G(z) can generally be designed to eliminate the precursor without amplifying high frequency noise. The FIR filter H(z) is included to remove the postcursor (which would otherwise interfere with the detection of later bits). H(z) is excited by the comparator output and therefore contributes no noise. To the extent that the filters remove the ISI, the signal at the input to the comparator is free from ISI and the comparator can detect the absence or presence of a pulse by detecting whether its input is below or above a threshold.

The digital signal processing blocks within the DFE can be replaced by RNS processing blocks. The FIR filters can be similar to that already described (without RNS-to-Binary conversion or scaling blocks on the outputs). The summing junction is an RNS subtractor. The comparator is formed by combining a subtractor (to set the threshold) and an RNS sign detector block. If the threshold is fixed, the subtractor block merely becomes a line renaming (rerouting) without any transistors. Note, too, that the filter H(z) can be simplified since it is known that its input can have only two values: "0" and "1". In particular, the Binary-to-RNS converter at the input to H(z) becomes trivial.

The one-hot RNS systems of the present invention are inefficient in terms of chip area, but the simplicity of the operational blocks under such a scheme results in small loading of the lines, in some cases no loading at all, which in turn results in a minimization of power dissipation and maximization of speed. Also, while the preferred embodiments of the present invention use a multidigit RNS number system in a one-hot physical representation of each digit, it should be recognized that a one-cold system could alternatively be used, or for that matter, each line of each digit could have its own state definitions. However the one-hot arrangement described herein is preferred as a logical state assignment.

Thus while various embodiments of the present invention have been disclosed and described in detail herein, it will be obvious to those skilled in the art that various changes in form and detail may be made therein without departing from the spirit and scope thereof.

What is claimed is:

1. A method of processing electronic signals to improve performance and reduce power consumption in electronic processing circuitry comprising the steps of:
   (a) receiving electronic signals on a plurality of input signal lines, each electronic signal encoded in one-hot RNS form such that one and only one input signal line of each digit of a plurality of RNS digits is in a different state to represent RNS numbers;
   (b) providing the electronic processing circuitry designed for processing electronic signals encoded in one-hot RNS form;
   (c) processing the electronic signals using the electronic processing circuitry designed for processing electronic signals encoded in one-hot RNS form to generate processed electronic signals represented in one-hot RNS form; and,
   (d) outputting processed electronic signals from the electronic processing circuitry onto a plurality of output signal lines.

2. The method of claim 1 comprising the further step of converting the processed electronic signals encoded in one-hot RNS form into processed electronic signals encoded in binary form prior to outputting processed electronic signals.

3. The method of claim 2 wherein the step of converting the processed electronic signals encoded in one-hot RNS form into processed electronic signals encoded in binary form comprises the step of first converting the encoding of processed electronic signals from one-hot RNS form into one-hot Associated Mixed Radix form, and then converting the encoding of processed electronic signals from one-hot Associated Mixed Radix form into binary form.

4. The method of claim 1 further comprising an initial step of converting electronic signals received in an encoded form other than a one-hot RNS encoded form into electronic signals encoded in one-hot RNS form such that one and only one signal line of each digit of a plurality of RNS digits is in a different state to represent RNS numbers.

5. The method of claim 4 wherein the electronic signals received are initially encoded in binary form.

6. The method of claim 1 wherein the processing includes summing two electronic signals encoded in one-hot RNS form to generate a processed electronic signal encoded in one-hot RNS form.

7. The method of claim 6 wherein the first of the two electronic signals is a variable encoded in one-hot RNS form and the second of the two electronic signals is a constant encoded in one-hot RNS form.

8. The method of claim 6 wherein both of the two electronic signals are variables encoded in one-hot RNS form.

9. The method of claim 1 wherein the processing includes subtracting one electronic signal encoded in one-hot RNS from another electronic signal encoded in one-hot RNS form to generate a processed electronic signal encoded in one-hot RNS form.

10. The method of claim 9 wherein one of the electronic signals is a variable in one-hot RNS form and the other of the electronic signals is a constant encoded in one-hot RNS form.

11. The method of claim 9 wherein each electronic signal is a variable encoded in one-hot RNS form.

12. The method of claim 1 wherein the processing includes multiplying one electronic signal encoded in one-hot RNS form to another electronic signal encoded in one-hot RNS form.

13. The method of claim 12 wherein one of the electronic signals is a variable encoded in one-hot RNS form and the other of the electronic signals is a constant encoded in one-hot RNS form.

14. The method of claim 12 wherein both of the two electronic signals are variables encoded in one-hot RNS form.

15. The method of claim 1 wherein the processing includes the step of changing a modulus of one of the electronic signals encoded in one-hot RNS form.

16. The method of claim 1 wherein the processing includes the step of scaling one of the electronic signals encoded in one-hot RNS form.

17. The method of claim 16 wherein the processing includes the step of recreating a modulus lost in the scaling of one of the electronic signals encoded in one-hot RNS form.

18. The method of claim 1 wherein the electronic signals can represent positive and negative numbers and the processing includes the step of determining whether one of the electronic signals encoded in one-hot RNS form represents a positive or a negative number.

19. The method of claim 1 wherein the processing comprises digital filtering.

20. The method of claim 19 wherein the digital filtering comprises finite impulse response filtering.

21. The method of claim 1 wherein the processing comprises decision feedback equalization.

22. The method of claim 1 wherein the electronic processing circuitry designed for processing electronic signals in one-hot RNS form is one or more circuit elements of the set of bilateral switches, logic gates, pull down switches, or reroutes of input signal lines to output signal lines.

23. A method of processing electronic signals representing to improve performance and reduce power consumption in electronic processing circuitry comprising the steps of:
   (a) receiving electronic signals encoded in one-hot RNS form on a plurality of conductive input signal lines, each electronic signal encoded in one-hot RNS form such that one and only one conductive input signal line of each digit of a plurality of RNS digits is in a different state to represent numbers in a Residue Number System wherein each number in a Reside Number System is represented by a number of digits N wherein N is greater than 1 and each digit has its own limited range:
   $X = x_{ma}, x_{mb}, \ldots, x_{mN}$
   where:
   $x_{ma}, x_{mb}, \ldots x_{mN}$ are each a digit in the RNS representation of the natural number X,
   $m_a, m_b \ldots m_N$ are the different integer number moduli, each associated with a respective digit in the RNS representation of the natural number X, and $x_{ma}, x_{mb}, \ldots x_{mN}$ each have a range of $m_a, m_b, \ldots, m_N$, respectively and where each digit $x_{ma}, x_{mb}, \ldots x_{mN}$ in the number X is represented by the state of a number $m_a, m_b \ldots m_N$ of conductive input signal lines, respectively, each conductive input signal line having two states, the representation of each digit value differing from the representation of any other digit value of the respective digit by a difference in states of exactly two of the conductive input signal lines representing the respective digit;

(b) providing the electronic processing circuitry designed for processing electronic signals encoded in one-hot RNS form;

(c) processing received electronic signals using electronic processing circuitry designed for processing electronic signals encoded in one-hot RNS form to generate processed electronic signals encoded in one-hot RNS form; and, (d) outputting processed electronic signals onto a plurality of conductive output signal lines.

24. The method of claim 23 wherein the processing includes the process of addition by an adder circuit designed for adding electronic signals encoded in one-hot RNS form.

25. The method of claim 23 wherein the processing includes the process of subtraction by a subtractor circuit designed for subtracting electronic signals encoded in one-hot RNS form.

26. The method of claim 23 wherein the processing includes the process of multiplication by a multiplier circuit designed for multiplying electronic signals encoded in one-hot RNS form.

27. The method of claim 23 wherein the processing includes the step of changing a modulus of an electronic signal encoded in one-hot RNS form.

28. The method of claim 23 wherein the processing includes the step of scaling of an electronic signal encoded in one-hot RNS form.

29. The method of claim 28 wherein the processing includes the step of recreating a digit of a modulus lost in the scaling of the electronic signal encoded in one-hot RNS form.

30. The method of claim 23 wherein the electronic signal encoded in one-hot RNS form can represent positive and negative numbers and the processing includes the step of determining whether the electronic signal encoded in one-hot RNS form represents a positive or a negative number.

31. The method of claim 23 wherein the processing comprises digital filtering.

32. The method of claim 31 wherein the digital filtering comprises finite impulse response filtering.

33. The method of claim 23 wherein the processing comprises decision feedback equalization.

34. The method of claim 23 wherein the electronic processing circuitry designed for processing electronic signals in one-hot RNS form is one or more circuit elements of the set of bilateral switches, logic gates, pull down switches, or reroutes of input signal lines to output signal lines.

35. Apparatus for processing electronic signals encoded in one-hot RNS form to improve performance and lower power consumption comprising:

a first input for receiving a first input electronic signal encoded in one-hot RNS form having a plurality of first input lines $m_{ai}+m_{bi}+\ldots+m_{Ni}$, where $m_{ai}, m_{bi} \ldots m_{Ni}$ are $N_i$ different integer numbers and $N_i$ is greater than 1, each input line having two states, the first input lines being logically organized into $N_i$ groups of lines, each having $m_{ai}, m_{bi} \ldots m_{Ni}$ lines respectively, each first input electronic signal represented by the states of the lines, the states of the lines in each of the $N_i$ groups of lines for any represented first input electronic signal differing from the states of the lines in the respective group of lines of any other first input electronic signal, if at all, by exactly two lines in the respective group whereby one and only one line in the respective group of first input lines is in a different state from the other lines in order to represent the first input electronic signal;

a plurality of output lines $m_{ao}+m_{bo}+\ldots+m_{No}$, for outputting processed electronic signals where $m_{ao}, m_{bo} \ldots m_{No}$ are $N_o$ different integer numbers and $N_o$ is greater than 1, each output line having two states, the output lines being logically organized into No groups of lines, each having $m_{ao}, m_{bo} \ldots m_{No}$ lines respectively, each processed electronic signal represented by the states of the lines, the states of the output lines in each of the $N_o$ groups of lines for any represented processed electronic signal differing from the states of the lines in the respective group of lines of any other processed electronic signal, if at all, by exactly two lines in the respective group whereby one and only one line in the respective group of output lines is in a different state from the other lines in order to represent the processed electronic signal; and one-hot RNS circuitry, designed for processing electronic signals encoded in one-hot RNS form, coupled to the first input having the plurality of first input lines for receiving the first input electronic signal encoded in one-hot RNS form and the plurality of output lines for outputting the processed electronic signal, the one-hot RNS circuitry generating the state of the output lines representing the processed electronic signal responsive to the present state of the first input lines representing a present input of the first input electronic signal.

36. The apparatus of claim 33 wherein the one-hot RNS circuitry generating the state of the output lines is also responsive to a prior state of the first input lines representing a prior input of the first input electronic signal.

37. The apparatus of claim 35 further having a second input for receiving a second input electronic signal encoded in one-hot RNS form having a plurality of second input lines $m_{ai}+m_{bi}+\ldots+m_{Ni}$, each input line having two states, the second input lines being logically organized into $N_i$ groups of lines, each having $m_{ai}, m_{bi} \ldots m_{Ni}$ lines respectively, each second input electronic signal represented by the states of the lines, the states of the second input lines in each of the $N_i$ groups of lines for any represented second input electronic signal differing from the states of the lines in the respective group of lines of any other representable second input electronic signal, if at all, by exactly two lines in the respective group whereby one and only one line in the respective group of second input lines is in a different state from the other lines in order to represent the second input electronic signal; and wherein the one-hot RNS circuitry coupled to the first input is coupled to the second input having the plurality of second input lines for receiving the second input electronic signal encoded in one-hot RNS form, the one-hot RNS circuitry generating the state of the output lines representing the processed electronic signal responsive to the present state of the first input lines and the present state of the second input lines respectfully representing the present input of the first input electronic signal and a present input of the second input electronic signal.

38. The apparatus of claim 37 wherein the one-hot RNS circuitry includes an adder and the states of the output lines generated by the one-hot RNS circuitry represent a sum of the information represented by the first input electronic signal and the second input electronic signal and the respective states of the first input lines and the second input lines.

39. The apparatus of claim 37 wherein the one-hot RNS circuitry includes a subtractor and the states of the output lines generated by the one-hot RNS circuitry represent a difference of the information represented by the first input electronic signal and the second input electronic signal and the respective states of the first input lines and the second input lines.

40. The apparatus of claim 37 wherein the one-hot RNS circuitry includes a multiplier and the states of the output lines generated by the one-hot RNS circuitry represent a product of the information represented by the first input electronic signal and the second input electronic signal and the respective states of the first input lines and the second input lines.

41. An electronic circuit for processing electronic signals to improve performance and lower power consumption, the electronic circuit comprising:

a plurality of input signal lines for receiving input electronic signals input on the plurality of input signal lines, each input electronic signal encoded in one-hot RNS form such that one and only one input signal line of each digit of a plurality of RNS digits is in a different state to represent RNS numbers;

a one-hot RNS processor, designed for processing electronic signals encoded in one-hot RNS form, coupled to the plurality of input signal lines to generate processed electronic signals encoded in one-hot RNS form in response to the input electronic signals, the one-hot RNS processor comprising one or more of a one-hot RNS adder, a one-hot RNS subtractor, or a one-hot RNS multiplier designed for processing electronic signals encoded in one-hot RNS form; and, a plurality of output signal lines coupled to the one-hot processor for outputting the processed electronic signals, each processed electronic signal encoded in one-hot RNS form such that one and only one output signal line of each digit of a plurality of RNS digits is in a different state to represent RNS numbers.

42. The electronic circuit of claim 41 further comprising an electronic signal encoding converter coupled between the one-hot RNS processor and the plurality of output signal lines, the electronic signal encoding converter receiving the processed electronic signals encoded in one-hot RNS form and generating processed electronic signals encoded in a binary form onto the plurality of output signal lines.

43. The electronic circuit of claim 42 wherein the electronic signal encoding converter further comprises apparatus for converting the processed electronic signals encoded in one-hot RNS form into processed electronic signals encoded in one-hot Associated Mixed Radix form, and apparatus for converting the processed electronic signals encoded in one-hot Associated Mixed Radix form into processed electronic signals encoded in binary form.

44. The electronic circuit of claim 41 further comprising an electronic signal encoding converter coupled to the plurality of input signal lines, the electronic signal encoding converter receiving input electronic signals encoded in a form other than one-hot RNS form and generating input electronic signals encoded in one-hot RNS form onto the plurality of input signal lines.

45. The electronic circuit of claim 44 wherein the form other than one-hot RNS form is a binary form and the electronic signal encoding converter receives the input electronic signals in a binary form and generates input electronic signals encoded in one-hot RNS form onto the plurality of input signal lines.

46. The electronic circuit of claim 41 wherein the one-hot RNS processor includes the one-hot RNS adder for the addition of two input electronic signals encoded in one-hot RNS form.

47. The electronic circuit of claim 46 wherein the one-hot RNS adder comprises apparatus for adding two input electronic signals encoded in one-hot RNS form, the first input electronic signal being a variable encoded in one-hot RNS form and the second input electronic signal of the two signals being a constant encoded in one-hot RNS form.

48. The electronic circuit of claim 46 wherein the one-hot RNS adder comprises apparatus for adding two input electronic signals encoded in one-hot RNS form, both of the two input electronic signals being variables encoded in one-hot RNS form.

49. The electronic circuit of claim 41 wherein the one-hot RNS processor includes the one-hot RNS subtractor for the subtraction of two input electronic signals encoded in one-hot RNS form.

50. The electronic circuit of claim 49 wherein the one-hot RNS subtractor comprises apparatus for subtracting two input electronic signals, the first input electronic signal of the two signals being a variable encoded in one-hot RNS form and the second input electronic signal of the two input electronic signals being a constant encoded in one-hot RNS form.

51. The electronic circuit of claim 49 wherein the one-hot RNS subtractor comprises apparatus for subtracting two input electronic signals encoded in one-hot RNS form, both of the two input electronic signals being variables encoded in one-hot RNS form.

52. The electronic circuit of claim 41 wherein the one-hot RNS processor includes the one-hot RNS multiplier for the multiplication of two input electronic signals encoded in one-hot RNS form.

53. The electronic circuit of claim 41 wherein the one-hot RNS processor includes the one-hot RNS multiplier for the multiplication of two input electronic signals, the first of the two input electronic signals being a variable encoded in one-hot RNS form and the second of the two input electronic signals being a constant encoded in one-hot RNS form.

54. The electronic circuit of claim 41 wherein the one-hot RNS processor includes the one-hot RNS multiplier for the multiplication of two input electronic signals, both of the two input electronic signals being variables encoded in one-hot RNS form.

55. The electronic circuit of claim 41 wherein the one-hot RNS processor further comprises apparatus for changing a modulus of one of the input electronic signals encoded in one-hot RNS form.

56. The electronic circuit of claim 41 wherein the one-hot RNS processor further comprises apparatus for scaling one of the input electronic signals encoded in one-hot RNS form.

57. The electronic circuit of claim 56 wherein the one-hot RNS processor includes apparatus for recreating a modulus lost in the scaling of one of the input electronic signals encoded in one-hot RNS form.

58. The electronic circuit of claim 41 wherein the RNS numbers can represent positive and negative numbers and the one-hot RNS processor includes apparatus for determining whether one of the input signals encoded in one-hot RNS form represents a positive or a negative number.

59. The electronic circuit of claim 41 wherein the one-hot RNS processor further comprises apparatus for digital filtering.

60. The electronic circuit of claim 57 wherein the apparatus for digital filtering comprises apparatus for finite impulse response filtering.

61. The electronic circuit of claim 41 wherein the one-hot RNS processor further comprises apparatus for decision feedback equalization.

62. A one-hot RNS arithmetic circuit for combining a first input signal encoded in a one-hot RNS form moduli N having N first input signal lines and a second input signal encoded in a one-hot RNS form moduli N having N second input signal lines to generate an arithmetic output signal encoded in a one-hot RNS form moduli N having N output signal lines, the one-hot RNS arithmetic circuit comprising:

N inverters coupled to the second input signal to generate an inverted second input signal for control of the generation of the arithmetic output signal, each one of the N inverters respectively coupled to each one of the N second input signal lines to generate the inverted second input signal on each of one of the N inverted second input signal lines; and N groups of N bilateral switches each having an input terminal, an output terminal, a control signal terminal and an inverted control signal terminal, each group of N bilateral switches having N input terminals coupled respectively to the N first input signal lines of the first input signal, each group of N bilateral switches having N output terminals coupled together to one of the N output signal lines of the arithmetic output signal, each group of N bilateral switches having N control signal terminals and N inverted control signal terminals respectively coupled to a different set of N second input signal lines and N inverted signal lines for providing the arithmetic combination of the first input signal and the second input signal to generate the arithmetic output signal encoded in one-hot RNS form on the N output signal lines.

63. The one-hot RNS arithmetic circuit of claim 62, wherein the one-hot RNS arithmetic circuit is an adder circuit and each group of N bilateral switches having N control signal terminals and N inverted control signal terminals is respectively coupled to the different set of N second input signal lines and N inverted signal lines to generate a sum of the first input signal and the second input signal as the arithmetic output signal encoded in one-hot RNS form on the N output signal lines.

64. The one-hot RNS arithmetic circuit of claim 62, wherein the one-hot RNS arithmetic circuit is a subtractor circuit and each group of N bilateral switches having N control signal terminals and N inverted control signal terminals is respectively coupled to the different set of N second input signal lines and N inverted signal lines to generate a difference of the first input signal and the second input signal as the arithmetic output signal encoded in one-hot RNS form on the N output signal lines.

65. The one-hot RNS arithmetic circuit of claim 62, wherein each of the bilateral switches is an n-channel device and a p-channel device having the control signal terminal coupled to the gate of the n-channel device and the inverted control signal terminal coupled to the gate of the p-channel device with each source and drain respectively coupled to the input terminal and the output terminal of the bilateral switch.

66. A one-hot RNS multiplier circuit for multiplying a first input signal encoded in a one-hot RNS form moduli N having N first input signal lines with a second input signal encoded in a one-hot RNS form moduli N having N second input signal lines where N is a prime number, the one-hot RNS multiplier circuit for generating a product output signal encoded in a one-hot RNS form moduli N having N output signal lines, the one-hot RNS multiplier comprising:

N−1 inverters coupled to N−1 second input signal lines excluding a second input signal line representing the number zero to generate an inverted N−1 second input signal on each of one of the respective N−1 inverted second input signal lines;

N−1 groups of N−1 bilateral switches each having an input terminal, an output terminal, a control signal terminal and an inverted control signal terminal, each group of N−1 bilateral switches having N−1 input terminals coupled respectively to the N−1 first input signal lines of the first input signal, each group of N−1 bilateral switches having N−1 output terminals coupled together to one of the N−1 output signal lines of the sum output signal excluding the output signal line representing the number zero, each group of N−1 bilateral switches having N−1 control signal terminals and N−1 inverted control signal terminals respectively coupled to a different set of N−1 second input signal lines and N−1 inverted signal lines to generate the product of the first input signal and the second input signal on the N−1 product output signal lines encoded in one-hot RNS form;

an OR gate having one input coupled to a first input signal line representing the number zero and another input coupled to a second input signal line representing the number zero and an output of the OR gate coupled to an output signal line representing the number zero for generating a logic level on the output signal line representing the number zero; and N−1 pull down transistors each coupled to one of the N−1 output signal lines excluding the output signal line representing the number zero, the N−1 pull down transistor pulling down on the N−1 output signal lines excluding the output signal line representing the number zero when the product is zero.

67. The one-hot RNS multiplier circuit of claim 66, wherein each of the bilateral switches is an n-channel device and a p-channel device having the control signal terminal coupled to the gate of the n-channel device and the inverted control signal terminal coupled to the gate of the p-channel device with each source and drain respectively coupled to the input terminal and the output terminal of the bilateral switch.

68. The one-hot RNS miltiplier circuit of claim 66, wherein each of the N−1 pull down transistors is an n-channel device having a source connected to ground, a drain connected to a respective one of the N−1 output signal lines excluding the output signal line representing the number zero, and a gate where each gate is coupled together and to the second input signal line representing the number zero.

* * * * *

UNITED STATES PATENT AND TRADEMARK OFFICE
CERTIFICATE OF CORRECTION

PATENT NO. : 5,987,487  
DATED : November 16, 1999  
INVENTOR(S) : Welland

Page 1 of 1

It is certified that error appears in the above-identified patent and that said Letters Patent is hereby corrected as shown below:

Title page,
Item [56], References Cited, U.S. PATENT DOCUMENTS,
Please delete patent number "5,187,420" and insert -- 5,189,420 --.

Claim 36,
Line 1, please delete "claim 33" and insert -- claim 35 --.

Claim 60,
Line 1, please delete "claim 57" and insert -- claim 59 --.

Signed and Sealed this

Nineteenth Day of February, 2002

*Attest:*

JAMES E. ROGAN
*Attesting Officer*     *Director of the United States Patent and Trademark Office*